(12) United States Patent (10) Patent No.: US 8,053,911 B2
Hayashi et al. (45) Date of Patent: Nov. 8, 2011

(54) SEMICONDUCTOR DEVICE AND DATA PROCESSOR

(75) Inventors: Toru Hayashi, Tokyo (JP); Motoo Suwa, Tokyo (JP); Kazuo Murakami, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/889,607

(22) Filed: Sep. 24, 2010

(65) Prior Publication Data

US 2011/0016345 A1    Jan. 20, 2011

Related U.S. Application Data

(63) Continuation of application No. 12/342,742, filed on Dec. 23, 2008, now Pat. No. 7,816,795.

(30) Foreign Application Priority Data

Mar. 19, 2008  (JP) .................................. 2008-070680

(51) Int. Cl.
*H01L 23/58* (2006.01)
*H01L 23/02* (2006.01)

(52) U.S. Cl. ........................................ 257/798; 257/678
(58) Field of Classification Search ........................ None
See application file for complete search history.

(56) References Cited

FOREIGN PATENT DOCUMENTS

JP    2007-213375    8/2007

*Primary Examiner* — Scott B Geyer
(74) *Attorney, Agent, or Firm* — Mattingly & Malur, PC

(57) ABSTRACT

Synchronization between command and address signals commonly coupled to a plurality of memory devices to be operated in parallel and a clock signal coupled to the memory devices is achieved, while suppressing an increase in the clock wiring length. A semiconductor device has a data processing device mounted on a wiring substrate and a plurality of memory devices accessed in parallel by the data processing device. The data processing device outputs the command and address signals as a first frequency from command and address terminals, and outputs a clock signal as a second frequency from a clock terminal. The second frequency is set to multiple times of the first frequency, and an output timing equal to or earlier than a cycle starting phase of the clock signal output from the clock terminal can be selected to the command and address signals output from the command and address terminals.

7 Claims, 19 Drawing Sheets

CLOCK WIRING TOPOLOGY
(TWO DDR-SDRAM'S MOUNTED ON ONE SIDE)

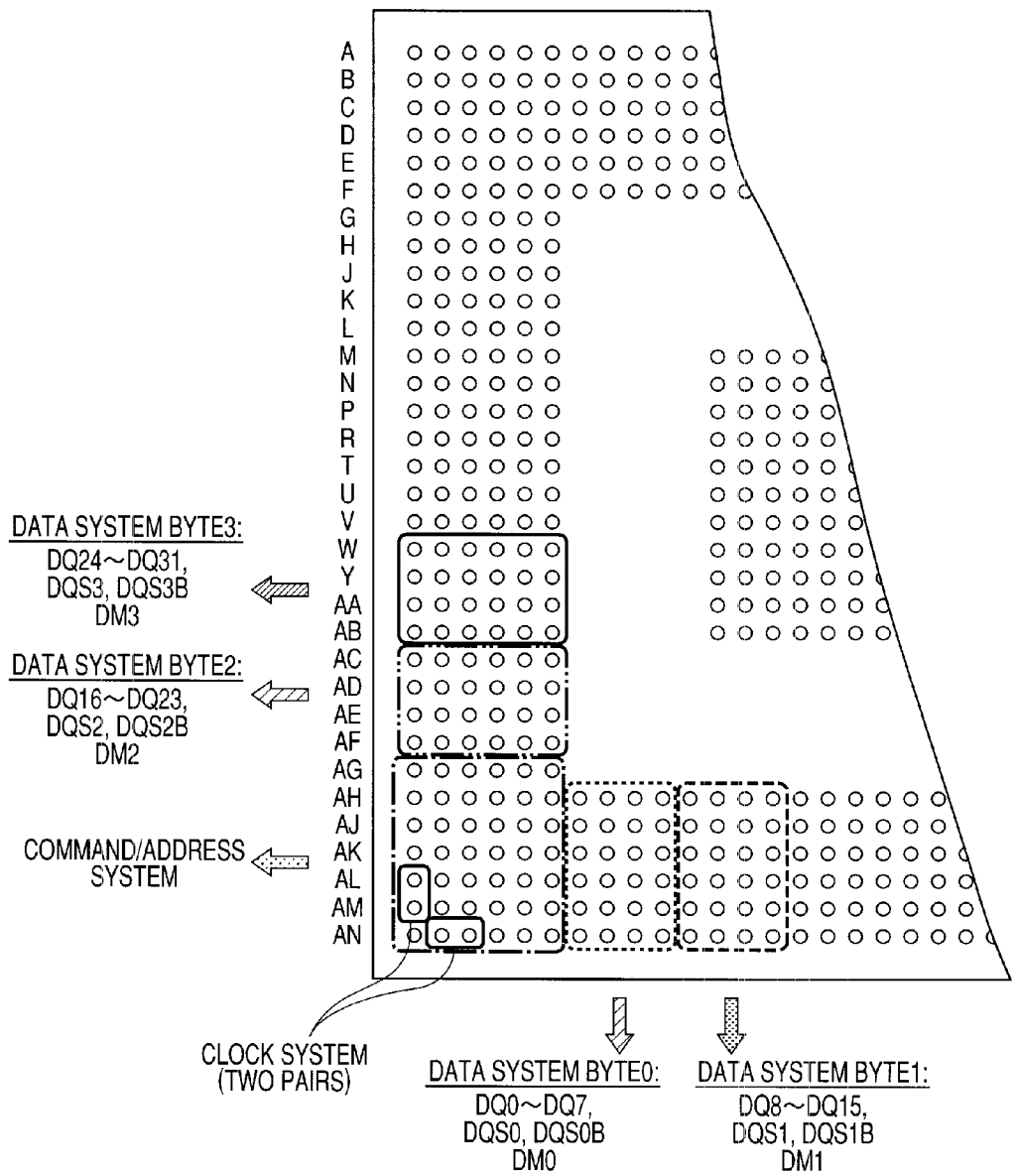

SEMICONDUCTOR DEVICE AND DATA PROCESSOR

CROSS-REFERENCE TO RELATED APPLICATIONS

This is a continuation application of U.S. application Ser. No. 12/342,742, filed Dec. 23, 2008, now U.S. Pat. No. 7,816,795, the contents of which are hereby incorporated by reference into this application.

The present application claims priority from Japanese patent application No. 2008-70680 filed on Mar. 19, 2008, the content of which is hereby incorporated by reference into this application.

BACKGROUND OF THE INVENTION

The present invention relates to a technique to optimize a connection configuration of a plurality of memory devices and a data processing device for controlling the same on a wiring substrate, and an output phase relationship between a clock signal and a command and address signal which the data processing device supplies to the memory devices. For example, the present invention relates to a technique effectively applied to a semiconductor device in the form of a mother board having a DDR (Double Data Rate) 2-SDRAM (Synchronous Dynamic Random Access Memory) compliant with JEDEC STANDARD No. 79-2D and a memory controller mounted therein.

Patent Document 1 (Japanese patent laid-open No. 2007-213375), which is the previous application by the present applicant, discloses a semiconductor device in the form of a mother board, wherein a memory controller is on-chip mounted along both side edges of a corner portion of a data processing device in the form of an SOC, and a memory device is arranged opposite to the corresponding both side edges, respectively. This specification discloses a configuration in which two DDR2-SDRAMs are arranged as the memory devices and the data processing device simultaneously accesses these memory devices. In particular, while a command and address signal is supplied in parallel from the data processing device to the memory devices via a common substrate wiring, a clock signal is separately supplied to the memory devices via separate clock wirings.

SUMMARY OF THE INVENTION

The present inventor has studied how to increase the number of memory devices to be mounted in a semiconductor device in the form of a mother board. In this case, a clock signal supplied to an SDRAM in the form of DDR has two times the frequency of a command and address signal, and it is therefore necessary to reduce the wiring impedance, total load capacitance, and number of branches in the clock signal wiring and to improve a balance in the wire length after branching, thereby preventing the transitional waveform of the clock signal from being distorted. In this respect, the clock signal wiring may be divided for each memory device as described in Patent Document 1. However, if the clock signal wiring is separately provided for each memory device also when the number of memory devices to be mounted is increased from two to four, then the occupied area of the clock wiring on a wiring substrate will increase and the number of clock terminals of the data processing device will also increase, which is not realistic. Then, the present inventor has reached an idea that each two memory devices are commonly coupled to each of two pairs of differential clock terminals of the data processing device.

In this case, furthermore, equalization of delays in the clock signal wiring and the command and address signal wiring also needs to be considered. That is, for the DDR2-SDRAM, the clock signal is the reference clock for a memory cycle and also serves as a basis for capturing a command and address, and therefore, the delays in the clock signal wiring and the command and address signal wiring need to be equalized. Since a differential clock wiring has lower impedance than that of a single-ended command and address signal wiring, the charge-and-discharge speed of a load becomes fast and accordingly the clock wiring needs to be lengthened corresponding to this increased speed. Moreover, when two memory devices are coupled to each clock terminal of the data processing device, the load capacitance will increase as compared with the case where one memory device is coupled thereto. On the other hand, since the command and address signal wiring is coupled to four memory devices, the load capacitance will increase. Therefore, also in this respect, the clock wiring also needs to be lengthened for the purpose of the equalization of delays.

However, as the degree of lengthening the clock signal wiring increases, the occupied area of the clock wiring will increase. Furthermore, if the clock signal wiring is lengthened, this wiring delay will increase and accordingly a difference in delays from a data strobe signal might not satisfy the specification of JEDEC. In addition, the round trip time after the data processing device outputs the clock signal until it receives the data strobe signal of read data from the memory device will increase and accordingly the memory read operation within a specified clock cycle might not be assured.

It is an object of the present invention to provide a semiconductor device, which can realize synchronization between a signal that is transmitted to a command and address signal wiring commonly coupled to a plurality of memory devices to be operated in parallel and a signal that is transmitted to a clock wiring coupled to the memory devices, while suppressing an increase in the clock wiring length as much as possible, and which thereby can reduce the area of a wiring substrate occupied by the clock wiring.

It is another object of the present invention to provide a data processor which can, even when a load capacitance of the command and address signal wiring commonly coupled to a plurality of memory devices to be operated in parallel increases, suppress an increase in length of the clock wiring coupled to the memory devices.

The above-described and other objects and novel features of the present invention will be apparent from the description of the present specification and the accompanying drawings.

The overview of a representative one among the inventions disclosed in the present application will be described briefly as follows.

That is, a semiconductor device comprises a data processing device mounted in a wiring substrate and a plurality of memory devices accessed in parallel by the data processing devices. The data processing device outputs a command and address signal at a first frequency from a command and address terminal and outputs a clock signal at a second frequency from a clock terminal. The second frequency is set to multiple times of the first frequency. For the command and address signal output from the command and address terminal, an output timing equal to or earlier than a cycle starting phase of the clock signal output from the clock terminal can be selected.

When four memory devices, for example, are commonly coupled to command and address terminals, and two memory devices are commonly coupled to one of the clock terminals and other two memory devices are coupled to other clock terminal, the command and address signal is output at an output timing earlier than the cycle starting phase of the clock signal output from the clock terminal, thereby eliminating, in equalizing the delays of the command and address signal and the clock signal, a need to lengthen the clock wiring by the corresponding time difference of the early output timing. On the other hand, if the load capacitance of the command and address wiring coupled to the command and address terminal is reduced by reducing the number of memory devices coupled to the command and address terminal to two, then the command and address signal is output at an output timing equal to the cycle starting phase of the clock signal output from the clock terminal, thereby achieving the equalization of the delays without significantly changing the clock delay with respect to the memory device.

Even if a difference occurs in the load capacitances of the command and address wiring corresponding to the number or the like of memory devices commonly coupled to the command and address terminal on the wiring substrate, it is not necessary to lengthen or change the wire length of the clock wiring on the wiring substrate for the purpose of equalizing the delays. As a result, the area on the wiring substrate occupied by the clock wiring can be reduced, and the miniaturization and the cost reduction of the semiconductor device, such as a mother board having a data processor and memory devices mounted therein, can be realized. Since the clock wiring does not need to be lengthened for the purpose of equalizing the delays between the command and address wiring and the clock wiring, the wiring delay will not become long relative to a data strobe signal, thereby contributing to prevention of a situation where the delay difference from the data strobe signal cannot satisfy the specification of JEDEC. In addition, the round trip time will not become undesirably long either, thus contributing also to prevention of a situation where the memory read operation within a specified clock cycle cannot be assured.

The effects obtained by the representative invention among the inventions disclosed in the present application are briefly described as follows.

That is, the synchronization between a signal that is transmitted to the command and address signal wiring commonly coupled to a plurality of memory devices to be operated in parallel and a signal that is transmitted to the clock wiring coupled to the memory devices can be achieved while suppressing an increase in the clock wiring length as much as possible, and thereby the area of the wiring substrate occupied by the clock wiring can be reduced.

Moreover, even when the load capacitance of the command and address signal wiring commonly coupled to a plurality of memory devices to be operated in parallel increases, an increase in the wiring length of the clock wiring coupled to the memory devices can be suppressed.

BRIEF DESCRIPTION OF THE DRAWINGS

FIG. 19 is an explanatory view illustrating a terminal arrangement of connection terminals with respect to DDR2-SDRAMs in a data processor 3.

DETAILED DESCRIPTION OF THE PREFERRED EMBODIMENTS

1. Overview of the Embodiments

Figure 1:
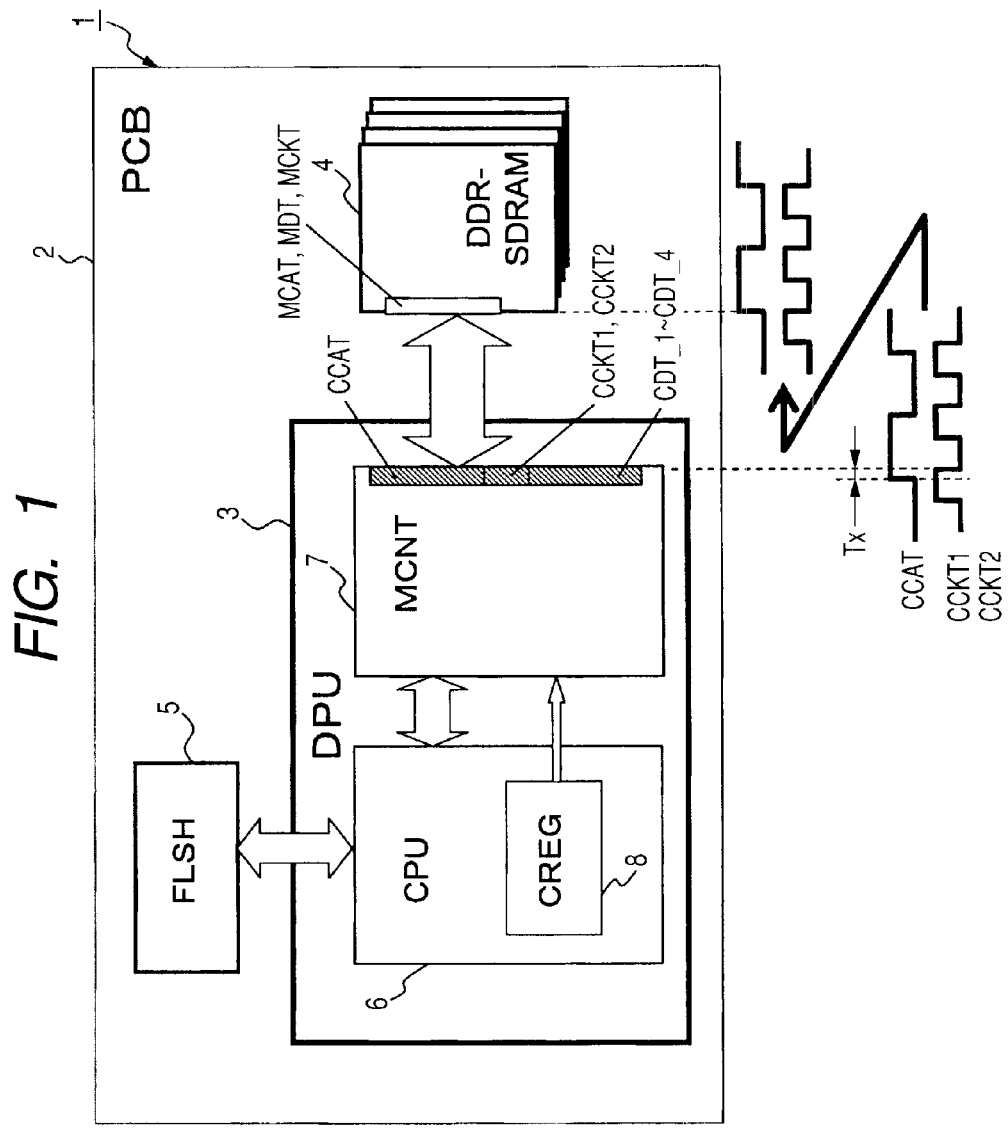
FIG. 1 is a block diagram of a semiconductor device in the form of a mother board, as an example of the present invention.

First, the overview of a representative embodiment of the invention disclosed in the present application will be described. In the overview description of the representative embodiment, reference symbol and numeral referred to with a parenthesis given thereto in the drawings just illustrates an element included in the concept of a component with the reference symbol and numeral given thereto.

[1] A semiconductor device according to an embodiment of the present invention comprises a wiring substrate, a data processing device (3) mounted in the wiring substrate, and a plurality of memory devices (4) mounted in the wiring substrate and coupled to the data processing device. The data processing device includes a plurality of data system terminals (CDT1 to CDT4) coupled to the memory devices, a plurality of command and address terminals (CCAT), a plurality of clock terminals (CCKT1, CCKT2), and a memory controller (7) for controlling inputs and outputs of these terminals. The wiring substrate includes individual wirings (DW_1 to DW_4, DW_12, DW_34) for coupling the data system terminals to the memory devices, individually, a first branch wiring (CAW) that branches the command and address terminal along its way and commonly couples the branched ones to the memory devices, and a second branch wiring (CW1, CW2) that branches the clock terminal along its way and couples the branched ones to the memory devices. The second branch wiring has the number of branches that is no more than the number of branches of the first branch wiring. The memory controller outputs a command and address signal at a first frequency from the command and address terminal and outputs a clock signal at a second frequency from the clock terminal. The second frequency is set to multiple times of the first frequency. For the command and address signal output from the command and address terminal, an output timing equal to or earlier than a cycle starting phase of the clock signal output from the clock terminal can be selected.

The command and address signal is output at an output timing earlier than the cycle starting phase of the clock signal output from the clock terminal, thereby eliminating, in equalizing the delays of the command and address signal and the clock signal, a need to lengthen the clock wiring by the corresponding time difference of the early output timing. On the other hand, if the load capacitance of the command and address wiring coupled to the command and address terminal is reduced, then the command and address signal is output at an output timing equal to the cycle starting phase of the clock signal output from the clock terminal, thereby achieving the equalization of the delays without significantly changing the clock delay with respect to the memory device.

Even if a difference occurs in the load capacitances of the command and address wiring in accordance with the number or the like of the memory devices commonly coupled to the command and address terminal on the wiring substrate, it is not necessary to lengthen or change the wire length of the clock wiring on the wiring substrate for the purpose of equalizing the delays. As a result, the area on the wiring substrate occupied by the clock wiring can be reduced, and the miniaturization and the cost reduction of the semiconductor device, such as a mother board having the data processor and the memory devices mounted therein, can be realized. Since the clock wiring does not need to be lengthened for the purpose of equalizing the delays between the command and address wirings and the clock wiring, the wiring delay will not become long relative to a data strobe signal, thus contributing to prevention of a situation where the delay difference from the data strobe signal cannot satisfy the specification of JEDEC. In addition, the round trip time will not become undesirably long either, thus contributing also to prevention of a situation where the memory read operation within a specified clock cycle cannot be assured.

[2] In item 1, the data processing device, for example, selects an early output timing from a plurality of output timings. Accordingly, the optimum selection can be made in accordance with the amount of wiring delay that cannot be adjusted by the clock wiring length on the wiring substrate.

[3] In item 2, the data processing device, for example, initializes the output timing of the command and address signal in a power-on-reset processing. This allows a program to control the setting of the output timing of the command and address signal.

[4] In item 1, the memory controller includes a variable delay circuit (17, 20), wherein the smaller a delay time set in the variable delay circuit becomes, the earlier the command and address signal output from the command and address terminal is output than the cycle starting phase of the clock signal output from the clock terminal. In this way, a circuit configuration for selecting the output timing of the command and address signal can be easily realized.

[5] In item 2, the data processing device (8) includes a CPU and a control register accessible by the CPU, wherein the delay time of the variable delay circuit is determined by control data that is written into the control register.

[6] In item 4, the variable delay circuit (17) is positioned, for example, in a transmission path of the command and address signal output from the command and address terminal.

[7] In item 4, the variable delay circuit (20) is positioned, for example, in a transmission path of a latch clock in a latch circuit (16) for latching the command and address signal output from the command and address terminal. As compared with the configuration of item 6, the circuit size of the variable delay circuit can be reduced.

[8] A semiconductor device according to another embodiment of the present invention comprises a wiring substrate, a data processing device mounted in the wiring substrate; and four memory devices (4_1 to 4_4) mounted in the wiring substrate and coupled to the data processing device. The data processing device includes: data system terminals (CDT1 to CDT4) separately coupled to the four memory devices; a command and address terminal (CCAT) commonly coupled to the four memory devices; a first clock terminal (CCKT1) coupled to two of the four memory devices; a second clock terminal (CCKT2) coupled to the other two of the four memory devices; and a memory controller (7) for controlling inputs and outputs of these terminals. The wiring substrate includes: a data system wiring (DW_1 to DW_4) for coupling the data system terminal to the memory device in one-to-one correspondence; a command and address wiring (CAW) that branches into four along its way, with the command and address terminal as a base point, to be commonly coupled to the four memory devices; a first clock wiring (CW1) that branches into two along its way, with the first clock terminal as a base point, to be commonly coupled to the two corresponding memory devices; and a second clock wiring (CW2) that branches into two along its way, with the second clock terminal as a base point, to be commonly coupled to the two corresponding memory devices. The memory controller, when controlling the four memory devices, outputs a command and address signal at a first frequency from the command and address terminal and outputs a clock signal at a second frequency from the first clock terminal and the second clock terminal. The second frequency is set to multiple times of the first frequency. For the command and address signal output from the command and address terminal, an output timing earlier than a cycle starting phase of the clock signals output from the first clock terminal and the second clock terminal can be selected.

If four memory devices are commonly coupled to the command and address terminals, and two memory devices are commonly coupled to one of the clock terminals, and other two memory devices are coupled to other clock terminal, then the command and address signal is output at an output timing earlier than the cycle starting phase of the clock signal output from the clock terminal, thereby eliminating, in equalizing the delays of the command and address signal and the clock signal, a need to lengthen the clock wiring by the corresponding time difference of the early output timing.

[9] In item 8, for example, the data system terminal, the command and address terminal, and the first and second clock terminals are arranged separately on both sides across a corner portion of the data processing device. The data system terminal is arranged spaced apart from the corner portion as compared with the command and address terminal and the first and second clock terminals. The two memory devices are opposingly mounted on both sides across the corner portion of the data processing device, in one surface of the wiring substrate, and the other two memory devices are mounted on other surface of the wiring substrate positioned on the back side of the two memory devices. The data system wiring extends toward a corresponding memory device from each side across the corner portion of the data processing device. The command and address wiring and the first and second clock wirings branch along their ways, with the corner portion of the data processing device as a base point, and extend toward each of the memory devices. As compared with the case where the data system terminal, the command and address terminal, and the first and second clock terminals are arranged along one side of the data processing device, this embodiment can contribute to the miniaturization of the data processing device and the miniaturization of the wiring substrate.

[10] In item 9, for example, each of the memory devices is a JEDEC-compliant DDR2 SDRAM having 8-bit memory data terminals, and a short side near the data terminal of the memory device is arranged opposite to a side of the data processing device. Accordingly, as compared with the case where a long side is arranged opposite to the side of the data processing device, the memory data terminal of each of the memory devices can be directly coupled using a wiring layer of the mounted surface, thus contributing to simplification of the data system wiring in the wiring substrate.

[11] A semiconductor device according to yet another embodiment, the present invention comprises a wiring substrate, a data processing device mounted in the wiring substrate, and two memory devices (4_12, 4_34) mounted in the wiring substrate and coupled to the data processing device. The data processing device includes: data system terminals (CDT_12, CDT_34) separately coupled to the two memory devices; a command and address terminal (CCAT) commonly coupled to the two memory devices, a clock terminal (CCKT1) coupled to the two memory devices, and a memory controller for controlling inputs and outputs of these terminals. The wiring substrate includes: data system wirings (DW_12, DW_34) for coupling the data system terminals to the memory devices in one-to-one correspondence; a command and address wiring (CAW) that branches into two along its way to commonly couple the command and address terminal to the two corresponding memory devices; and a clock wiring (CW1) that branches into two along its way to commonly couple the clock terminal to the two corresponding memory devices. The memory controller, in controlling the two memory devices, outputs a command and address signal at a first frequency from the command and address terminal and outputs a clock signal at a second frequency from the clock terminal. The second frequency is set to multiple times of the first frequency. For the command and address signal output from the command and address terminal, an output timing equal to or earlier than a cycle starting phase of the clock signal output from the clock terminal can be selected.

If the load capacitance of the command and address wiring coupled to the command and address terminal is reduced by reducing the number of memory devices coupled to the command and address terminal to two, as compared with the semiconductor device of the above item 8, then the command and address signal is output at an output timing equal to the cycle starting phase of the clock signal output from the clock terminal, thereby achieving the equalization of the delays without significantly changing the clock delay with respect to the memory device.

[12] In item 11, the data system terminal, the command and address terminal, and the first and second clock terminals are arranged separately on both sides across a corner portion of the data processing device, and the data system terminal is arranged spaced apart from the corner portion as compared with the command and address terminal and the first and second clock terminals. The two memory devices are mounted, in one surface of the wiring substrate, opposite to both sides across a corner portion of the data processing device. The data system wiring extends toward a corresponding memory device from each side across the corner portion of the data processing device, and the command and address wiring and the first and second clock wirings branch along their ways, with the corner portion of the data processing device as a base point, and extend toward each of the memory devices. As compared with the case where the data system terminal, the command and address terminal, and the first and second clock terminals are arranged along one side of the data processing device, this embodiment can contribute to the miniaturization of the data processing device and the miniaturization of the wiring substrate.

[13] In item 12, each of the memory devices is a JEDEC-compliant DDR2 SDRAM having 16-bit memory data terminals, and a long side of the memory device is arranged opposite to a side of the data processing device. As compared with the case where a short side is arranged opposite to the side of the data processing device, the distance of the command and address terminal becomes shorter between the both memory devices, thus contributing to the miniaturization of the wiring substrate.

[14] A data processor according to yet another embodiment of the present invention comprises a plurality of data system terminals, command and address terminals and clock terminals coupled to a memory device, respectively; a memory controller for controlling the data system terminals, the command and address terminals, and the clock terminals; and a CPU for controlling the memory controller. The memory controller outputs a command and address signal at a first frequency from the command and address terminal and outputs a clock signal at a second frequency from the clock terminal. The second frequency is set to multiple times of the first frequency. For the command and address signal output from the command and address terminal, an output timing equal to or earlier than a cycle starting phase of the clock signal output from the clock terminal can be selected. According to this, even if a difference occurs in the load capacitance of the command and address wiring in accordance with the number or the like of the memory devices commonly coupled to the command and address terminal on the wiring substrate, there is no need to lengthen or change the wire length of the clock wiring on the wiring substrate in order to equalize delays. As a result, the area on the wiring substrate occupied by the clock wiring can be reduced, and the miniaturization and the cost reduction of the semiconductor device, such as a mother board having a data processor and memory devices mounted therein, can be realized. Since the clock wiring does not need to be lengthened for the purpose of equalizing delays between the command and address wirings and the clock wiring, the wiring delay will not become long relative to a data strobe signal, thus contributing to prevention of a situation where the delay difference from the data strobe signal cannot satisfy the specification of JEDEC. In addition, the round trip time will not become undesirably long either, thus contributing also to prevention of a situation where the memory read operation within a specified clock cycle cannot be assured.

[15] In item 14, the memory controller selects, for example, the early output timing from a plurality of output timings, thereby handling the case where there is a difference in the wire lengths or the wiring delays on the wiring substrate or the case where the use of a memory device having a different input capacitance is envisioned.

[16] In item 15, the CPU initializes a selected status of the output timing for the command and address signal by the memory controller, in a power-on-reset processing. This allows for a selection of the output timing in program processing executed by the CPU.

[17] In item 15, the memory controller includes a variable delay circuit, wherein the smaller a delay time set in the variable delay circuit becomes, the earlier the command and address signal output from the command and address terminal is output than the cycle starting phase of the clock signal output from the clock terminal. The variable delay circuit is implemented by a gate delay circuit or a DLL (Delay Locked Loop) circuit.

[18] In item 17, for example, the memory controller further includes a control register accessible by the CPU, wherein the delay time of the variable delay circuit is determined by control data that is written into the control register.

[19] In item 17, the variable delay circuit is positioned, for example, in a transmission path of the command and address signal output from the command and address terminal.

In item 17, the variable delay circuit is positioned, for example, in a transmission path of a latch clock of a latch circuit for latching the command and address signal output from the command and address terminal. As compared with the configuration of item 19, the circuit size of the variable delay circuit can be reduced.

2. Details of the Embodiments

The embodiments will be described further in detail. Hereinafter, preferred embodiment for carrying out the present invention will be described in detail based on the accompanying drawings. Note that, in all the drawings for illustrating the preferred embodiment for carrying out the present invention, a member having the same function is given the same reference symbol and numeral, and the duplicated description thereof will be omitted.

<<Block Diagram of Mother Board>>

FIG. 1 shows a block diagram of a semiconductor device in the form of a mother board, as an example of the present invention. A semiconductor device (MDL) 1 comprises: a data processor (DPU) 3 that is a data processing device in the form of an SOC mounted in a wiring substrate (PCB) 2; a plurality of DDR2-SDRAMs 4 that are memory devices in the form of DDR; and a flash memory (FLSH) 5 that is a non-volatile memory. Although not limited in particular, assuming that the data processor 3 is mounted and used in a system substrate, such as a mother board, then the data processor 3 is sealed with a resin package or the like, and the mounting terminals for mounting the data processor 3 in the mother board are exposed. The data processor 3 includes a CPU (Central Processing Unit) 6 and a memory controller (MCNT) 7, as representatively shown in the view. Although not limited in particular, the flash memory 5 is used for a storage region for storing therein a program of the data processor, the trimming data for initialization, or the like, and is access-controlled by the data processor 3. The flash memory 5 may be on-chip mounted in the data processor 3. Although not limited in particular, the CPU 6 loads the trimming data, which is stored in the flash memory 5, into a control register (CREG) 8 as a part of the power-on-reset processing, and then the loaded trimming data is supplied to the memory controller or the like for the initialization thereof. The memory controller 7 carries out memory interface control to the DDR2-SDRAM 4 in response to a memory access control from the CPU 6 or the like. Although not limited in particular, in the following description, the number of data bits for parallel access to the DDR2-SDRAM 4 is assumed to be 32 bits.

Figure 17:
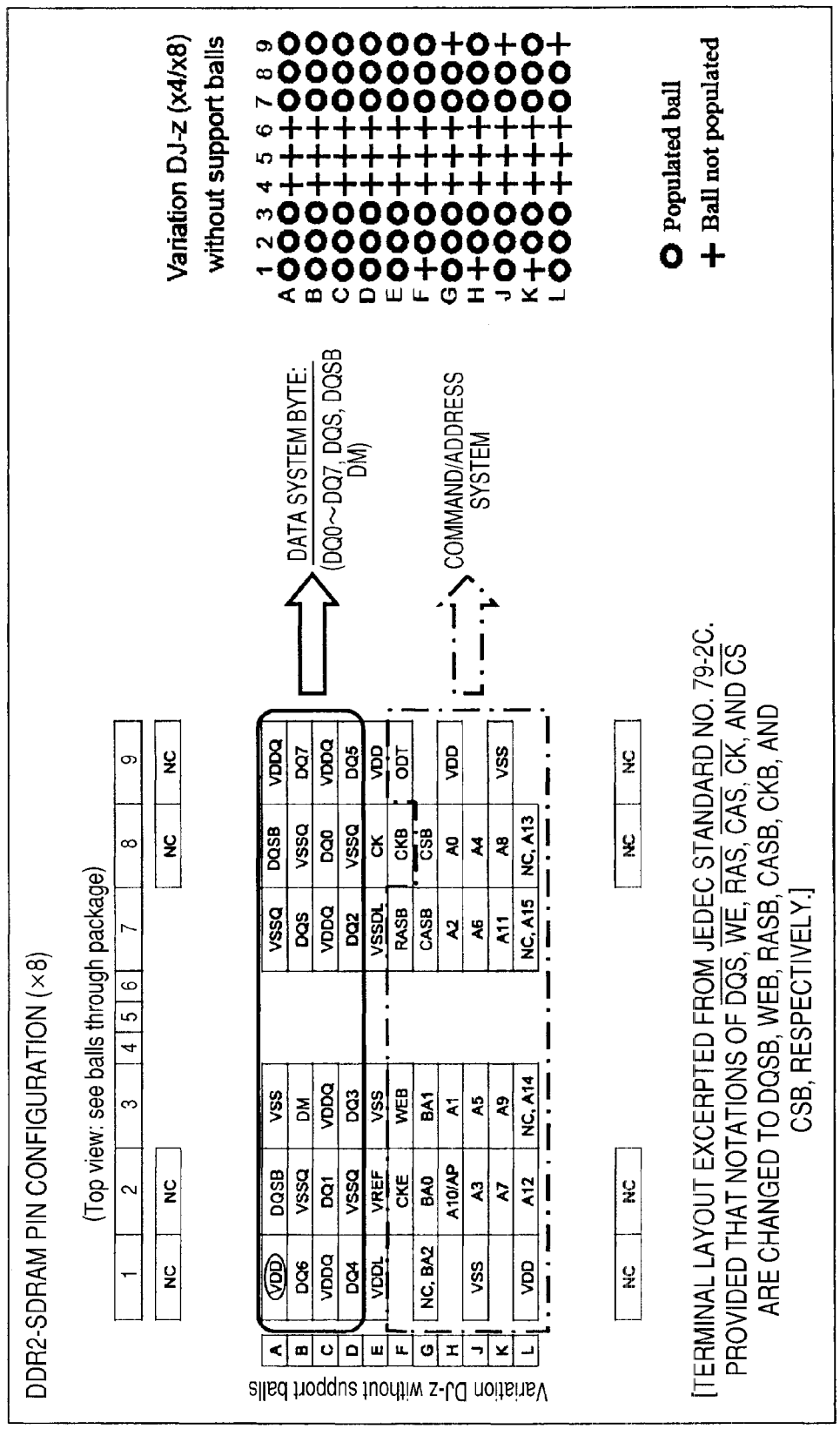
FIG. 17 is an explanatory view illustrating a pin configuration of a JEDEC STANDARD DDR2-SDRAM whose number of parallel data input/output bits is 8 bits (×8).
Figure 18:
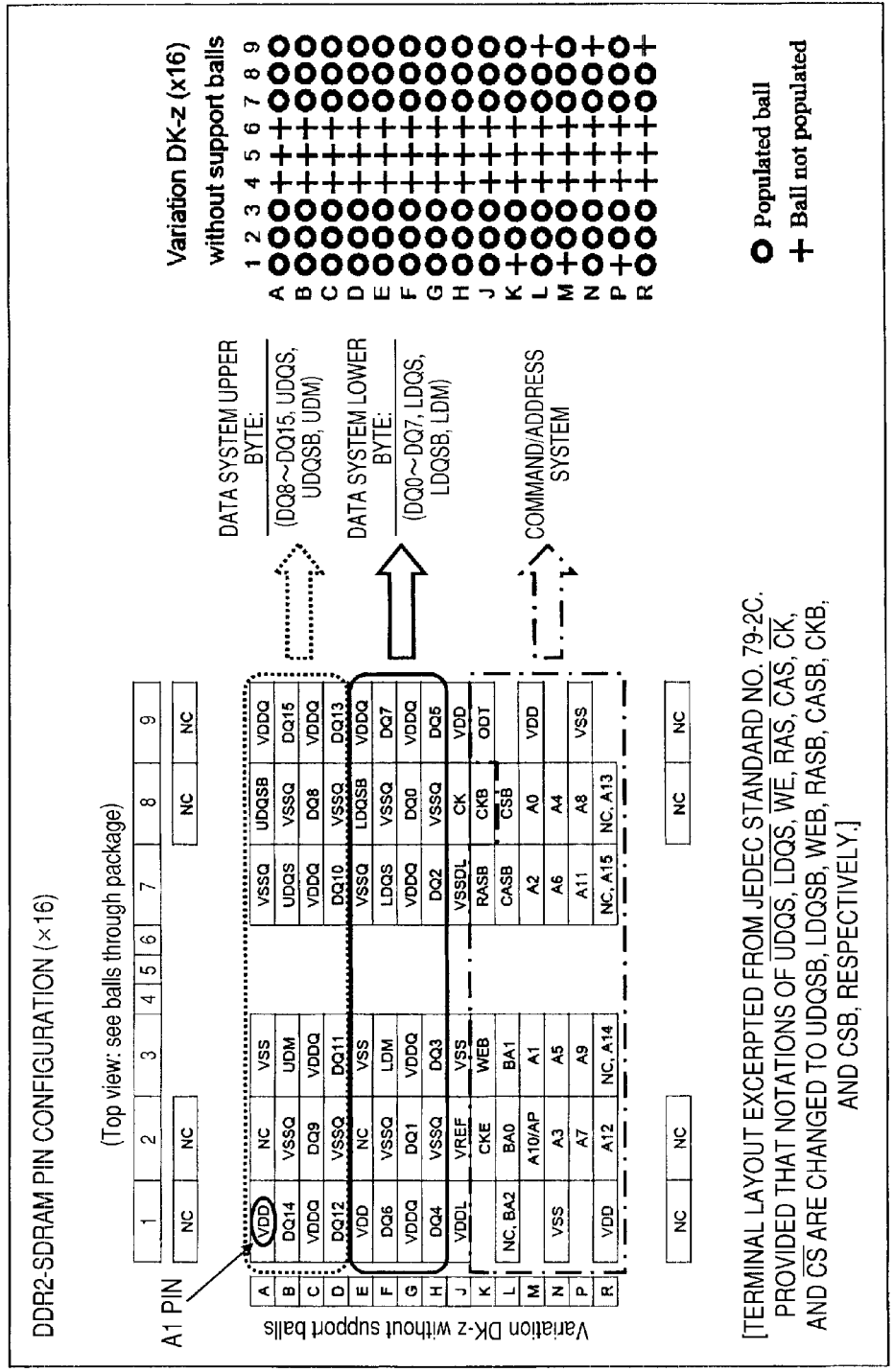
FIG. 18 is an explanatory view illustrating a pin configuration of a JEDEC STANDARD DDR2-SDRAM whose number of parallel data input/output bits is 16 bits (×16).

The DDR2-SDRAM includes a memory command and address terminal MCAT, a memory data system terminal MDT, and a memory clock terminal MCKT. According to the JEDEC STANDARD, for example, the memory command and address terminal MCAT includes address input terminals (A0 to An), bank address input terminals (BA0, BA1, BA2), a chip select input terminal (/CS), a row address strobe input terminal (/RAS), a column address strobe input terminal (/CAS), a write-enable input terminal (/WE), an on-die termination control input terminal (ODT), and a clock enable input terminal (CKE). The memory data system terminal MDT includes data input and output terminals (DQ0, DQx), data strobe input and output terminals (DQS, LDQS, UDQS), write mask enable input terminals (DM, LDM, UDM), and the like. The memory clock terminal MCKT includes a differential clock input terminal (CK, /CK). Other than the above, the memory clock terminal MCKT includes external terminals for a power supply system. Note that a symbol "/" given to a signal name indicates a low enable signal. In the view, four DDR2-SDRAMs 4 are illustrated, but not limited thereto in particular. FIG. 17 illustrates a pin configuration of a DDR2-SDRAM whose number of parallel data input/output bits is 8 bits (×8). FIG. 18 illustrates a pin configuration of a DDR2-SDRAM whose number of parallel data input/output bits is 16 bits (×16).

The data processor 3 includes data system input/output terminals CDT_1 to CDT_4 in the unit of byte data, a command and address output terminal CCAT, and two sets of clock output terminals CCKT1, CCKT2, each of which is differential, as the access control terminals capable of accessing the DDR2-SDRAM in 32 bits in parallel. The command and address output terminal CCAT corresponds to the memory command and address terminal MACT on one-to-one basis. A data terminal of the data system input/output terminals CDT1 to CDT4 is individually coupled to a data terminal of the memory data system terminal MDT of a plurality of DDR2-SDRAMs. The clock output terminals CCKT1, CCKT2 are coupled to a corresponding memory clock terminal MCKT. FIG. 19 illustrates a terminal arrangement of connection terminals with respect to the DDR2-SDRAM in the data processor 3. The terminal names correspond to the terminal names of FIG. 17 and FIG. 18. Data system Byte0 to data system Byte3 correspond to data system input/output terminals CDT_1 to CDT_4. A clock system (two pairs) corresponds to two sets of clock output terminals CCKT1, CCKT2, each of which is differential.

In the memory controller 7, as the output timing of the command and address signal output from the command and address output terminal CACT, an output timing equal to or earlier than a cycle starting phase of the clock signals output from the clock output terminals CCKT1, CCKT2 can be selected. FIG. 1 shows a case where the early timing is selected as the command and address signal, whereby even when the load capacitance or the like of the command and address wiring becomes large by mounting four SDRAMs, the delay in the clock wiring does not need to be increased in order to be equal to the delay in the command and address wiring. Hereinafter, this point will be described in detail considering a relationship with the device layout of the DDR2-SDRAM.

<<Mounting Configuration of DDR2-SDRAM>>

Figure 2:
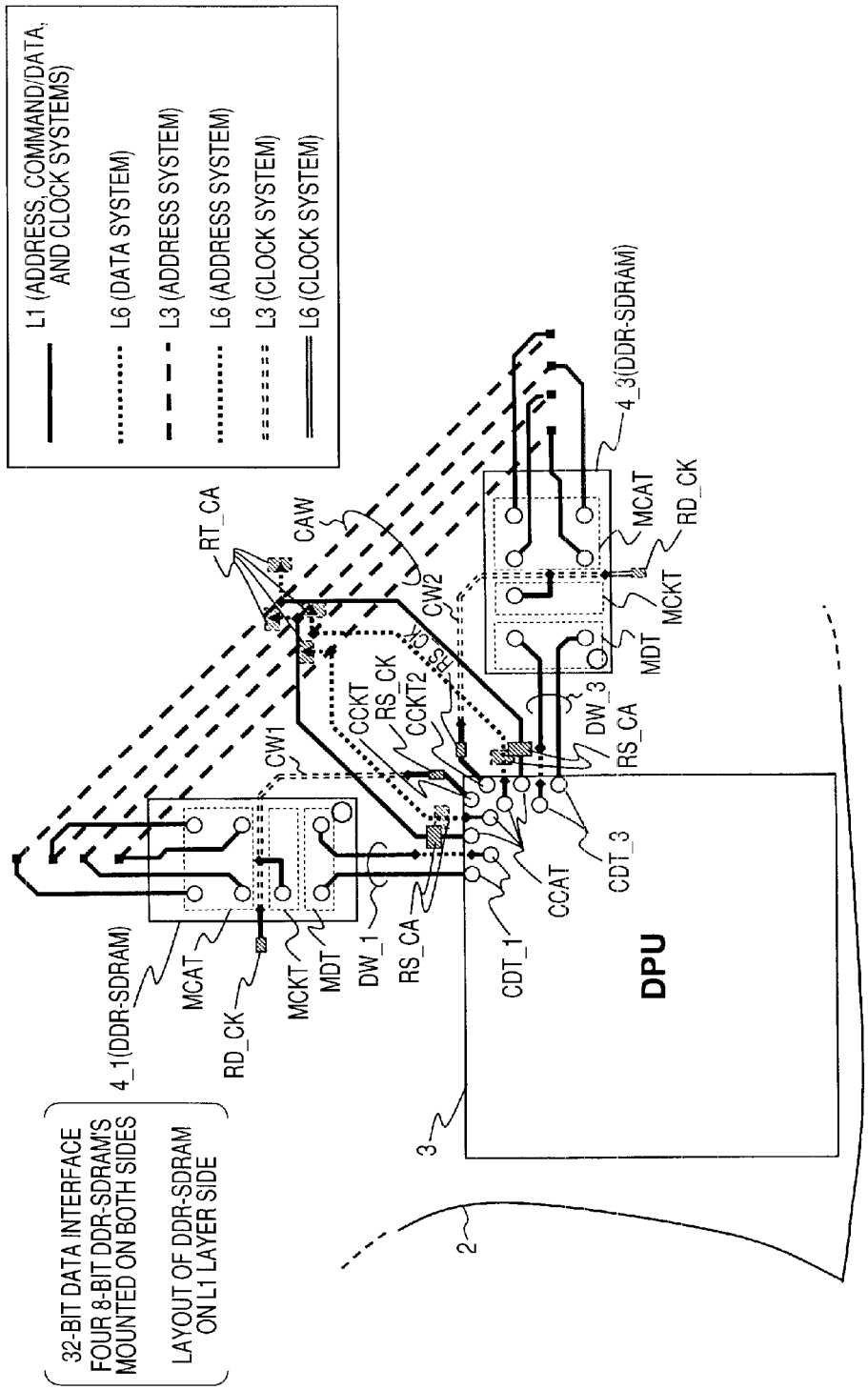
FIG. 2 is an explanatory view illustrating a layout viewed from the surface, when paying attention to DDR2-SDRAMs 4_1, 4_3 arranged in the surface of a wiring substrate, as a device layout using four DDR2-SDRAMs 4 whose number of parallel data input/output bits is 8 bits (×8 bit).
Figure 3:
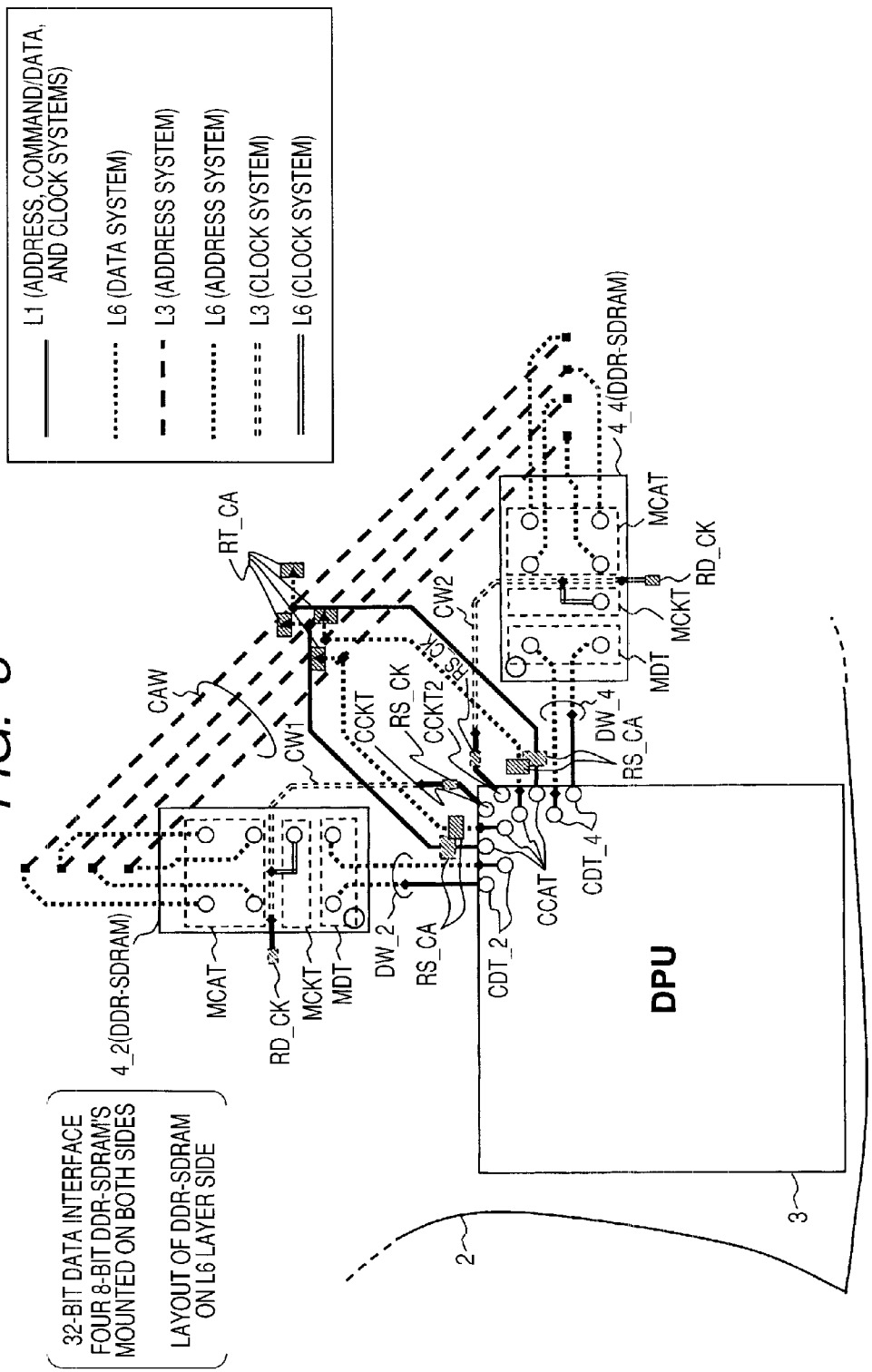
FIG. 3 is an explanatory view illustrating a layout viewed from the surface, when paying attention to DDR2-SDRAMs 4_2, 4_4 in the rear surface.

FIG. 2 and FIG. 3 illustrate device layouts using four DDR2-SDRAMs 4 whose number of parallel data input/output bits is 8 bits (×8). FIG. 2 shows a layout viewed from the surface, when paying attention to DDR2-SDRAMs 4_1, 4_3 arranged on the surface of the wiring substrate. FIG. 3 shows a layout viewed from the surface, when paying attention to the DDR2-SDRAMs 4_2, 4_4 in the rear surface. In each view, DPU 3 and DDR2-SDRAMs 4_1 to 4_4 are illustrated with a solid line, respectively.

Here, a JEDEC standard product is used as the DDR2-SDRAM 4. The memory command and address terminal MACT, the memory clock terminal MCKT, and the memory data system terminal MDT are separated from each other along the longitudinal direction of a rectangular package of the DDR2-SDRAM 4. In DPU 3, on both sides across a corner portion thereof, the command and address output terminal CCAT, the clock output terminals CCKT1, CCKT2, and the data system input/output terminals CDT_1 to CDT_4 are arranged separately from each other, wherein the data system input/output terminals CDT_1 to CDT_4 are spaced apart from the corner portion as compared with the command and address output terminal CACT and the clock output terminals CCKT1, CCKT2.

As shown in FIG. 2, the DDR2-SDRAMs 4_1, 4_3 are opposingly arranged on both sides across the corner portion of DPU 3, wherein the short side near the memory data system terminal MDT of the DDR2-SDRAMs 4_1, 4_3 faces DPU 3. The data system input/output terminal CDT_1 of DPU 3 is coupled to the memory data system terminal MDT of the DDR2-SDRAM 4_1 by a data system wiring DW_1. The data system input/output terminal CDT_3 of DPU 3 is coupled to the memory data system terminal MDT of DDR2-SDRAM 4_3 by a data system wiring DW_3. The command and address output terminal CCAT of DPU 3 is coupled to the memory command and address terminal MACT of the DDR2-SDRAMs 4_1, 4_3 by a command and address wiring CAW. The clock output terminal CCKT1 of DPU 3 is coupled to the clock input terminal MCKT of the DDR2-SDRAM 4_1 by a differential clock wiring CW1, while the clock output terminal CCKT2 of DPU 3 is coupled to the clock input terminal MCKT of the DDR2-SDRAM 4_3 by a differential clock wiring CW2. Note that, since the differential clock wiring transmits two clock signals, whose polarities are reversed with each other, over two wires, it allows for high frequency transmission, and is robust against noise, and furthermore it has lower impedance than a single-ended wire.

As shown in FIG. 3, the DDR2-SDRAMs 4_2, 4_4 are mounted in the rear surface of the wiring substrate 2, and has an arrangement overlapped with DDR2-SDRAMs 4_1, 4_3, wherein the short side near the memory data system terminal MDT of the DDR2-SDRAMs 4_2, 4_4 faces DPU 3 in a similar manner. The data system input/output terminal CDT_2 of DPU 3 is coupled to the memory data system terminal MDT of the DDR2-SDRAM 4_2 by a data system wiring DW_2. The data system input/output terminal CDT_4 of DPU 3 is coupled to the memory data system terminal MDT of the DDR2-SDRAM 4_4 by a data system wiring DW_4. The memory command and address terminal MACT of the DDR2-SDRAMs 4_2, 4_4 is also coupled to the command and address wiring CAW to be coupled to the command and address output terminal CCAT of DPU 3. The clock terminal MCKT of the DDR2-SDRAM 4_2 is further coupled to the differential clock wiring CW1 to be coupled to the clock output terminal CCKT1 of DPU 3, and similarly, the clock input terminal MCKT of the DDR2-SDRAM 4_4 is further coupled to the differential clock wiring CW2 to be coupled to the clock output terminal CCKT2 of DPU 3.

In FIG. 2 and FIG. 3, reference symbol RD CK denotes a differential termination resistor used for the differential clock wiring, RT_CA denotes a termination resistor of the command and address wiring, RS_CK denotes a matching resistor positioned along the way of the clock wiring, and RS_CA denotes a matching resistor arranged along the way of the commands and address wiring.

Figure 4:
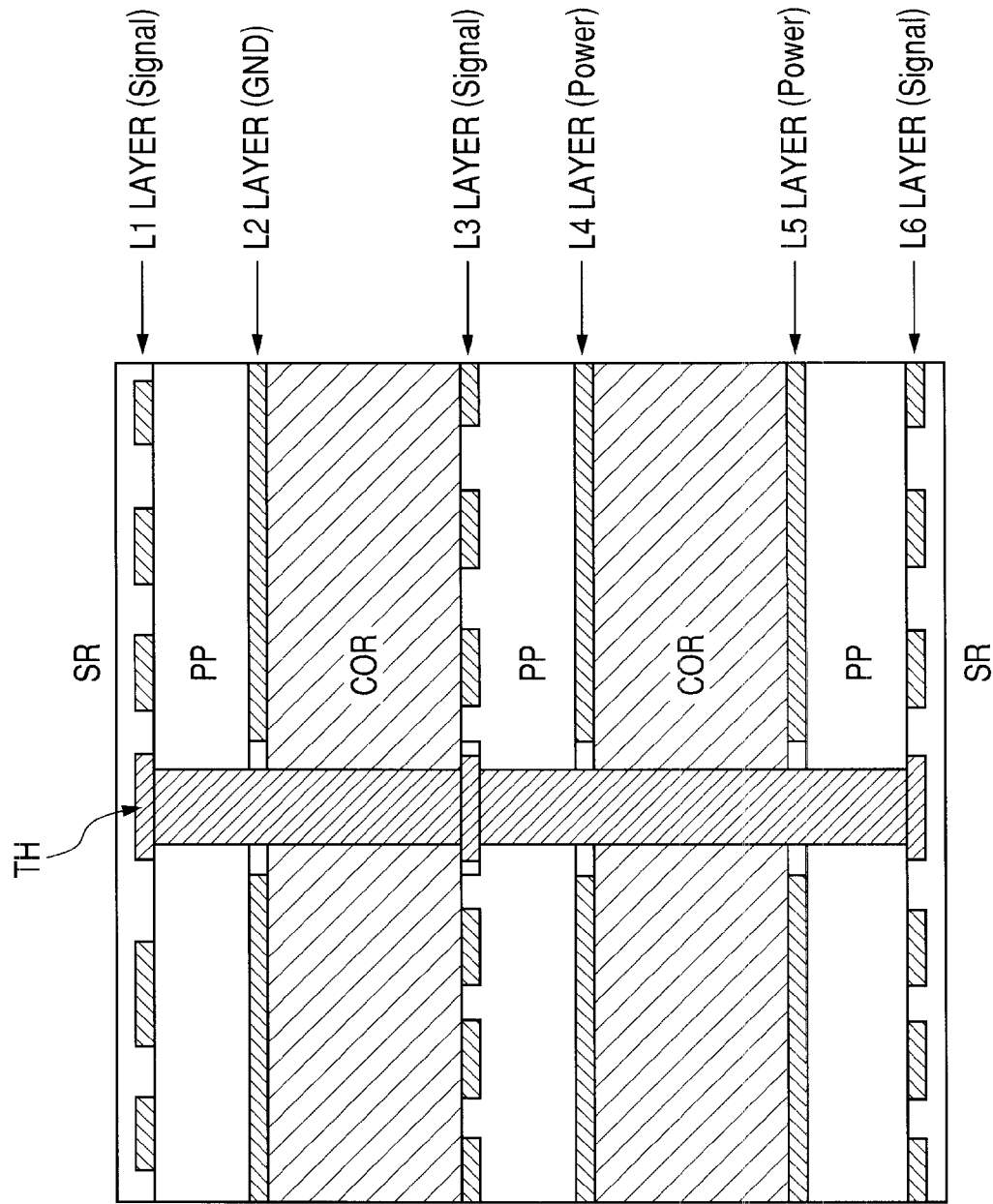
FIG. 4 is a cross sectional view illustrating a structure of a wiring layer of the wiring substrate.

The wiring substrate 2 includes six wiring layers of L1 to L6 as illustrated in FIG. 4. Reference symbol COR denotes a core layer. Reference symbol PP denotes a pre-preg layer and SR denotes a surface protection layer. Wiring layers L1, L3, and L6 are used for signal wirings, L2 is used for a ground pattern or the like, and L4 and L5 are used for a power supply pattern or the like. Reference symbol TH denotes an example of a through-hole used to couple wirings between layers.

Figure 5:
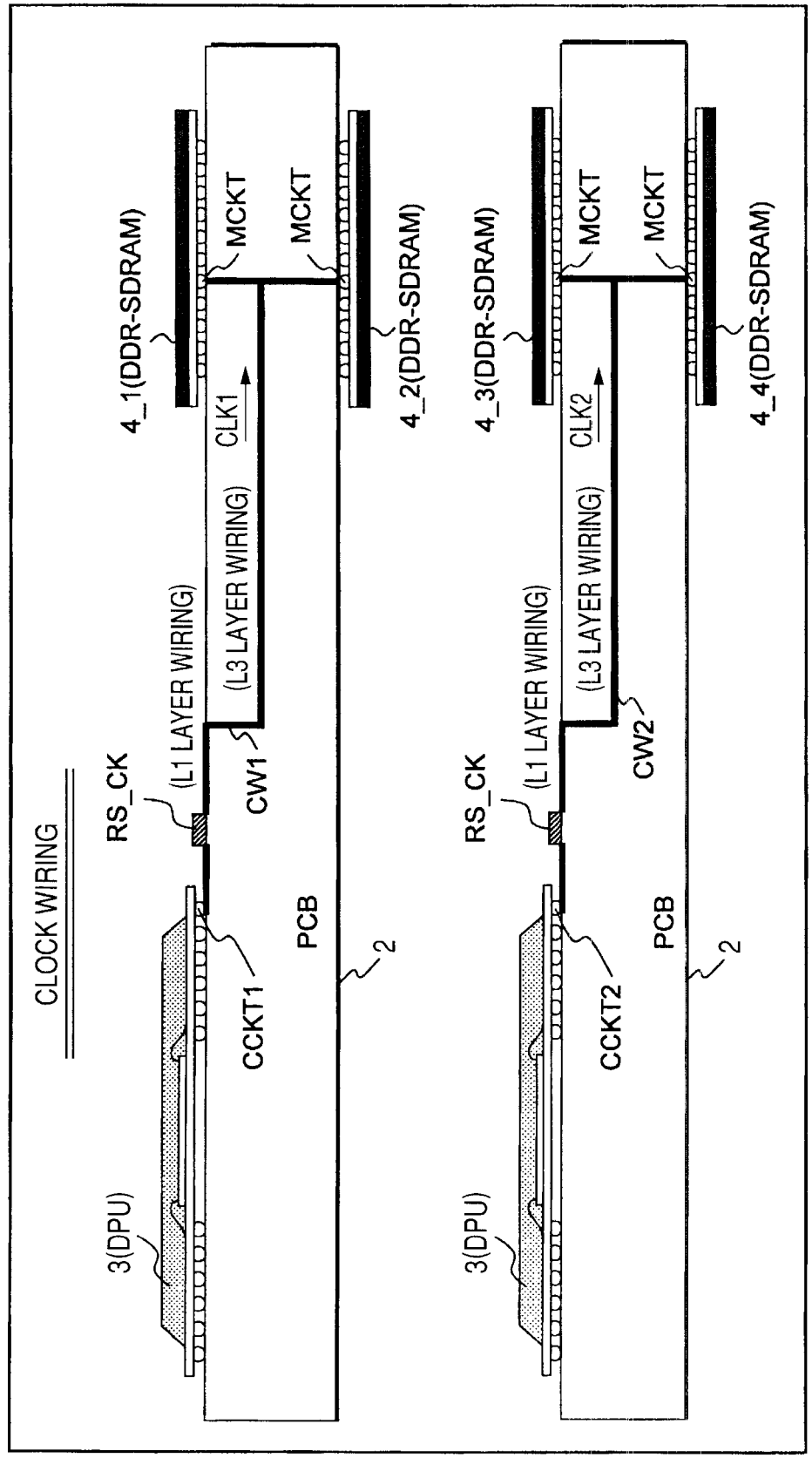
FIG. 5 shows cross sectional views schematically illustrating a longitudinal sectional structure along clock wirings CW1, CW2 of a semiconductor device 1, respectively.
Figure 6:
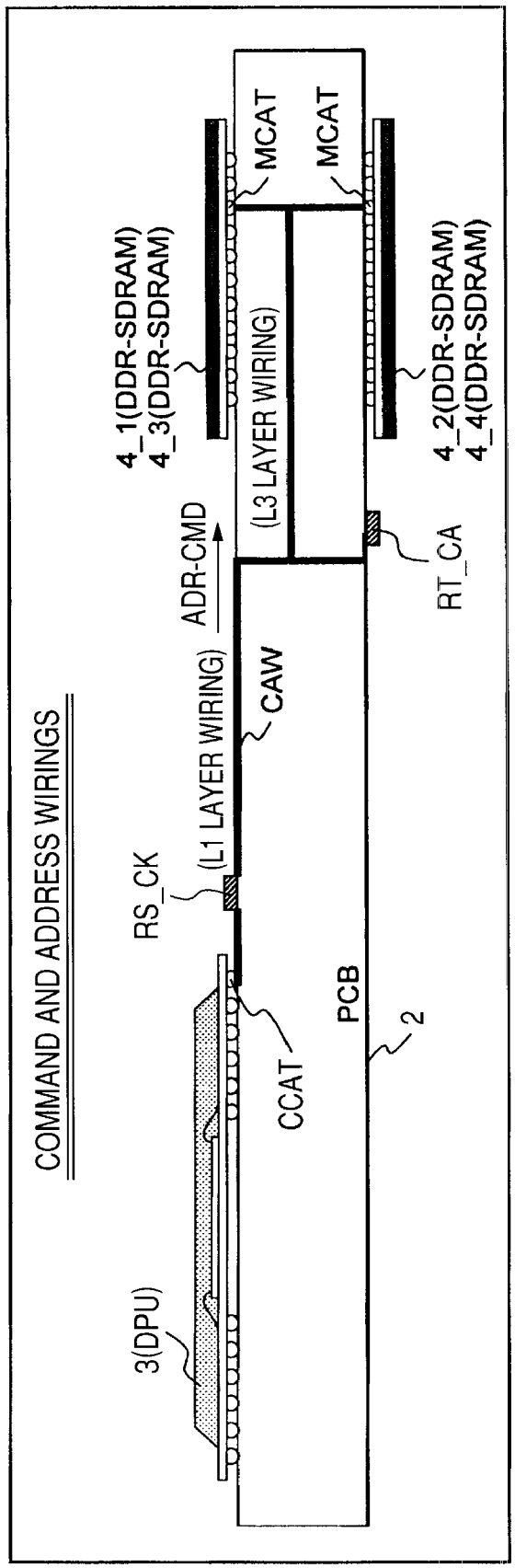
FIG. 6 is a cross sectional view schematically illustrating a longitudinal sectional structure along a command and address wiring CAW of the semiconductor device 1.

FIG. 5 schematically shows longitudinal sectional structures along the clock wirings CW1, CW2 of the semiconductor device 1. Reference symbol CLK1 denotes a clock signal transmitted to the clock wiring CW1, and CLK2 denotes a clock signal transmitted to the clock wiring CW2. FIG. 6 schematically shows a longitudinal sectional structure along the command and address wiring CAW of the semiconductor device 1. Reference symbol ADR-CMD denotes a command and address signal transmitted to the command and address wiring CAW.

Figure 7:
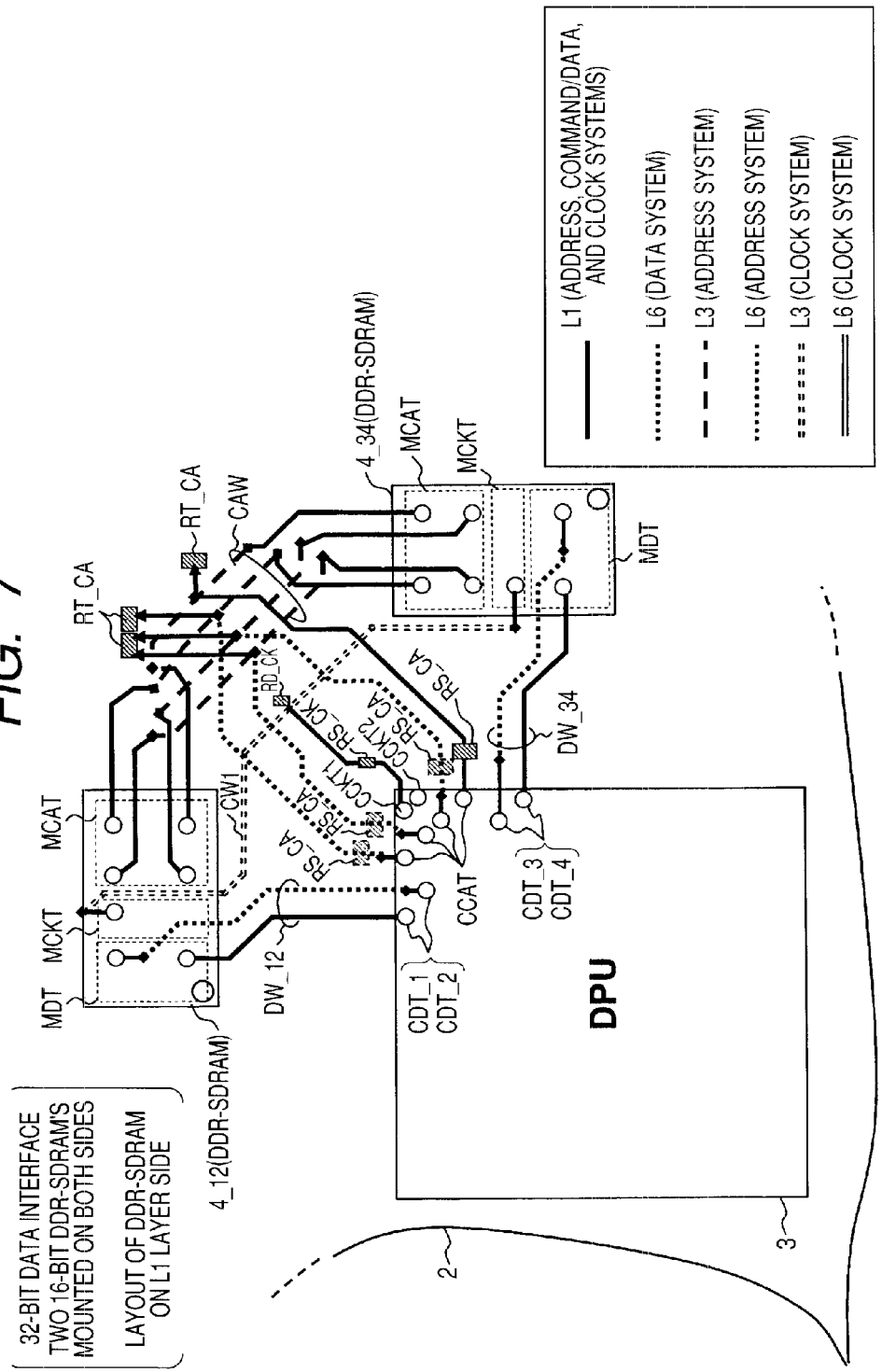
FIG. 7 is an explanatory view illustrating a device layout when two DDR2-SDRAMs 4 whose number of parallel data input/output bits is 16 bits (×16 bit) are used in place of four DDR2-SDRAMs 4_1 to 4_4.

FIG. 7 illustrate a device layout when two DDR2-SDRAMs 4 whose number of parallel data input/output bits is 16 bits (×16) are used in place of four DDR2-SDRAMs 4_1 to 4_4. Two DDR2-SDRAMs 4_12, 4_34 are arranged in the surface of the wiring substrate. The DDR2-SDRAMs 4_12, 4_34 are also the JEDEC standard products, and include the memory command and address terminal MACT, the memory clock terminal MCKT, and the memory data system terminal MDT for a rectangular package, as in the above-described case. The data input/output terminal of the memory data system terminal MDT has 16 bits. In this case, the DDR2-SDRAMs 4_12, 4_34 are opposingly arranged on both sides across the corner portion of DPU 3, wherein the long sides of the DDR2-SDRAMs 4_12, 4_34 face DPU 3. The data system input/output terminals CDT_1, CDT_2 of DPU 3 are coupled to the memory data system terminal MDT of the DDR2-SDRAM 4_12 by a data system wiring DW_12. The data system input/output terminals CDT_3, CDT_4 of DPU 3 are coupled to the memory data system terminal MDT of the DDR2-SDRAM 4_34 by a data system wiring DW_34. The command and address output terminal CCAT of DPU 3 is coupled to the memory command and address terminal MACT of the DDR2-SDRAMs 4_12, 4_34 by the command and address wiring CAW. The clock output terminal CCKT1 of DPU 3 is coupled to the clock input terminal MCKT of the DDR2-SDRAMs 4_12, 4_34 by the differential clock wiring CW1, and here the clock output terminal CCKT2 of DPU 3 is not used. In the mounting configuration of FIG. 4, since single-sided mounting is applied to the wiring substrate, the data system wiring can span the DDR2-SDRAM so as to allow the long side of the DDR2-SDRAM to face DPU 3 for mounting. As a result, as compared with the cases of FIGS. 2, 3, the distance between the memory command and address terminals MCAT can be reduced between the DDR2-SDRAMs and the size of the wiring substrate can be reduced further.

Figure 8:
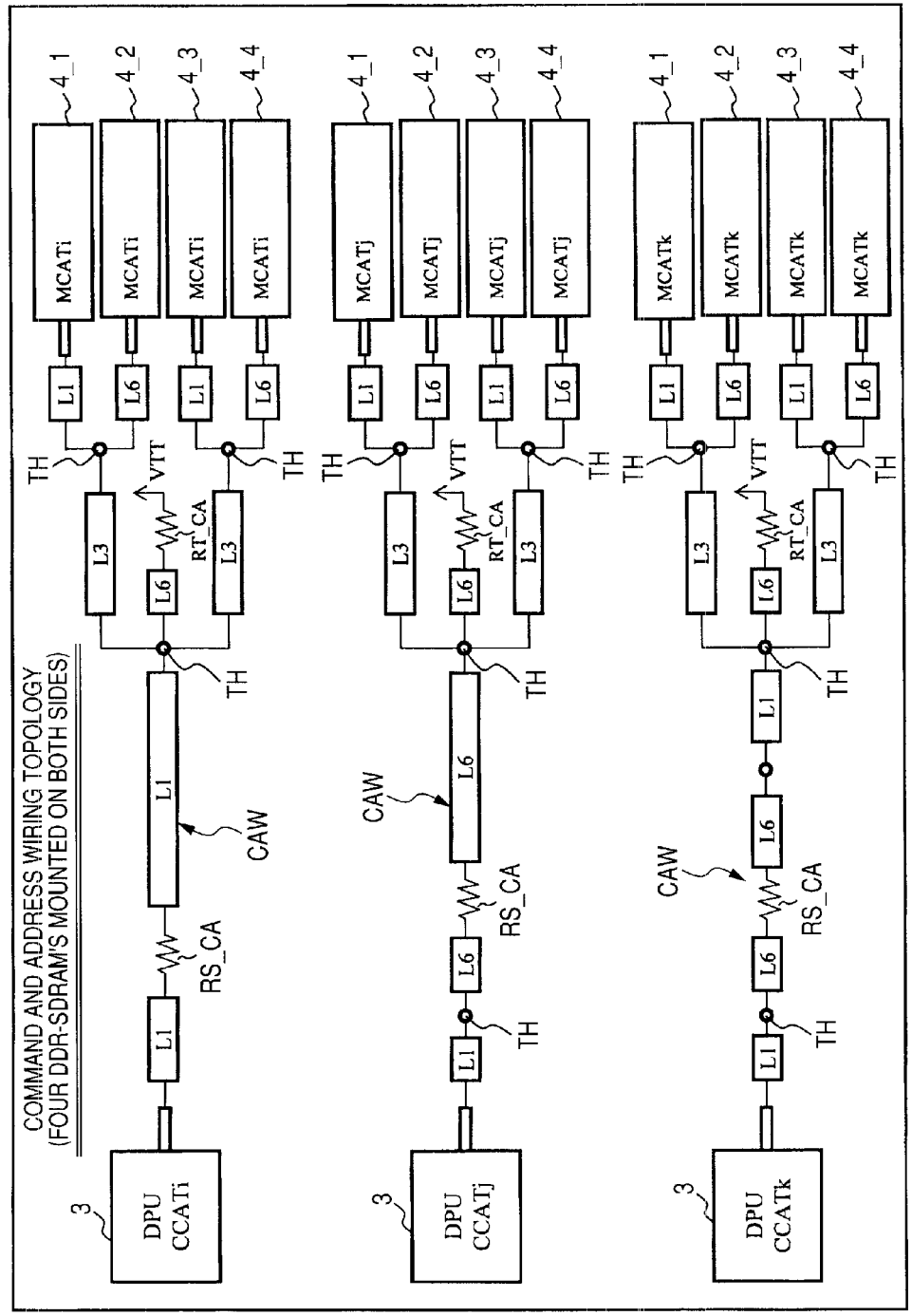
FIG. 8 is an explanatory view illustrating a wiring topology of the command and address wiring CAW when four DDR2-SDRAMs 4_1 to 4_4 are mounted in a wiring substrate 2 as shown in FIG. 2 and FIG. 3.

FIG. 8 illustrates a wiring topology of the command and address wiring CAW when four DDR2-SDRAMs 4_1 to 4_4 are mounted in the wiring substrate 2 as shown in FIG. 2 and FIG. 3. As shown in the view, there are three types of wiring topologies as represented by command and address output terminals CCATi, CCATj, and CCATk, however, in either case, one of the command and address output terminals CCATi, CCATj, and CCATk is coupled to a corresponding one of command and address input terminals MCATi, MCATj, and MCATk of the four DDR2-SDRAMs 4_1 to 4_4 via the wiring CAW that is branched into four along its way.

Figure 9:
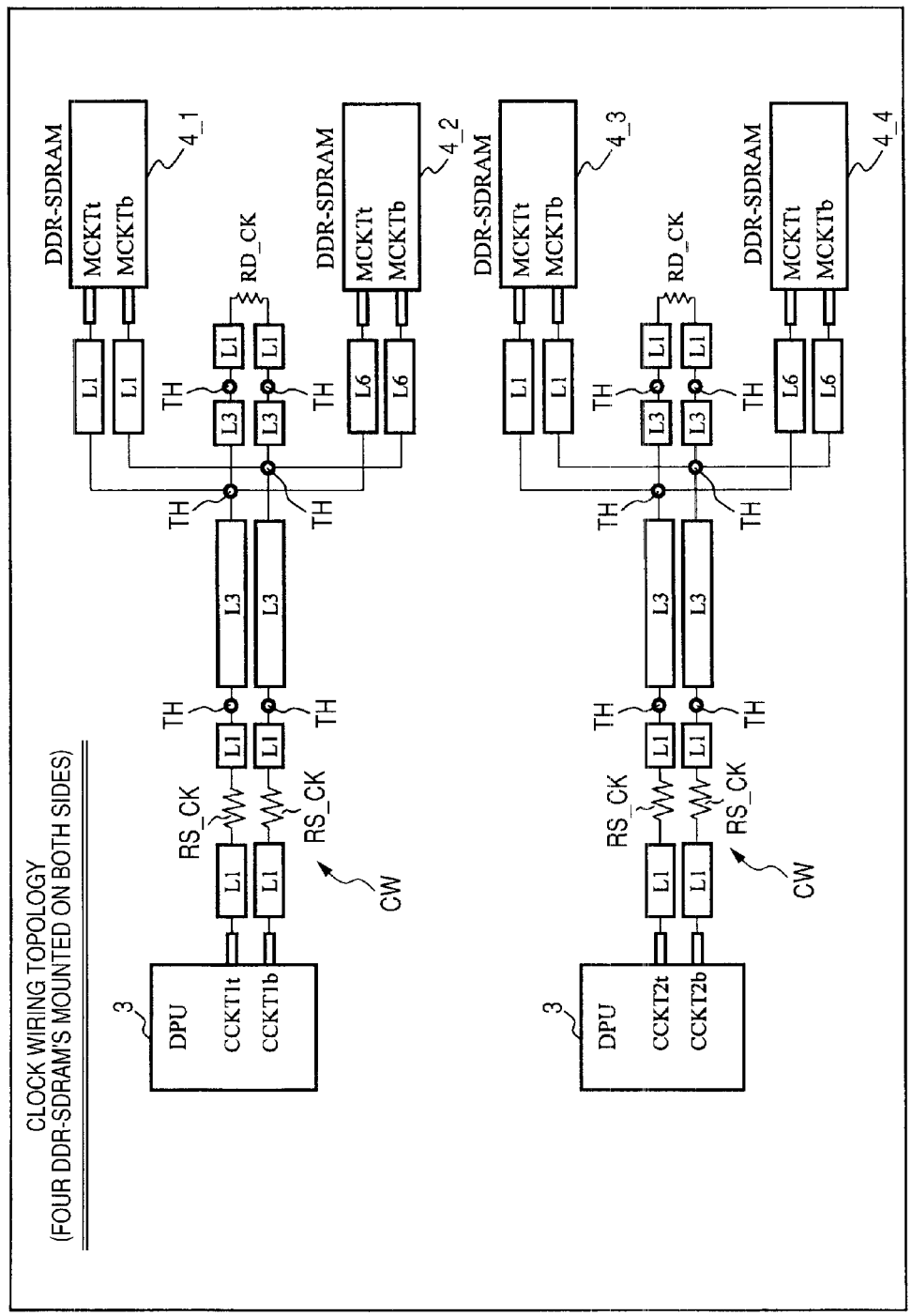
FIG. 9 is an explanatory view illustrating a wiring topology of a clock wiring CW when four DDR2-SDRAMs 4_1 to 4_4 are mounted in the wiring substrate 2 as shown in FIG. 2 and FIG. 3.

FIG. 9 illustrates a wiring topology of the clock wiring CW when four DDR2-SDRAMs 4_1 to 4_4 are mounted in the wiring substrate 2 as shown in FIG. 2 and FIG. 3. A differential clock output terminal CCKT1*t*, CCKT1*b* (suffix "t" indicates noninverting, while suffix "b" indicates inverting) is coupled to corresponding clock input terminals MCKTt, MCKTb of two DDR2-SDRAMs 4_1, 4_2 via the clock wiring CW1 that is branched into two along its way. A differential clock output terminal CCKT2*t*, CCKT2*b* is coupled to corresponding clock input terminals MCKTt, MCKTb of two DDR2-SDRAMs 4_3, 4_4 via the clock wiring CW2 that is branched into two along its way.

Figure 10:
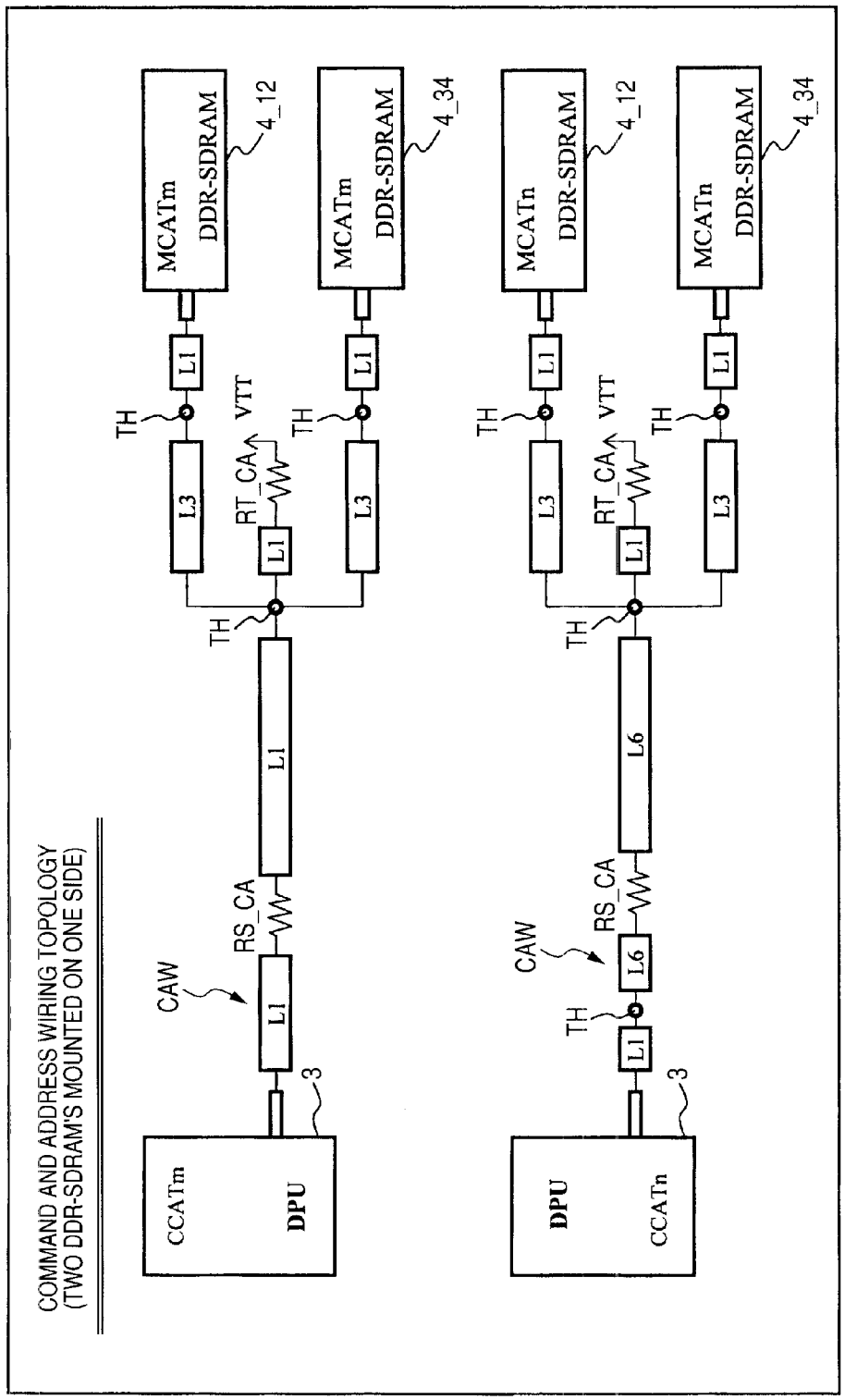
FIG. 10 is an explanatory view illustrating a wiring topology of the command and address wiring CAW when two DDR2-SDRAMs 4_12, 4_34 are mounted in the wiring substrate 2 as shown in FIG. 7.

FIG. 10 illustrates a wiring topology of the command and address wiring CAW when two DDR2-SDRAMs 4_12, 4_34 are mounted in the wiring substrate 2 as shown in FIG. 7. As shown in the view, there are two types of wiring topologies as represented by command and address output terminals CCATm and CCATn, however, in either case, one of the command and address output terminals CCATm, CCATn is coupled to a corresponding one of command and address input terminals MCATm, MCATn of the two DDR2-SDRAMs 4_12, 4_34 via the wiring CAW that is branched into two along its way. The load capacitance of the command and address wiring CAW in FIG. 10 is a half the load capacitance in the case of FIG. 8.

Figure 11:
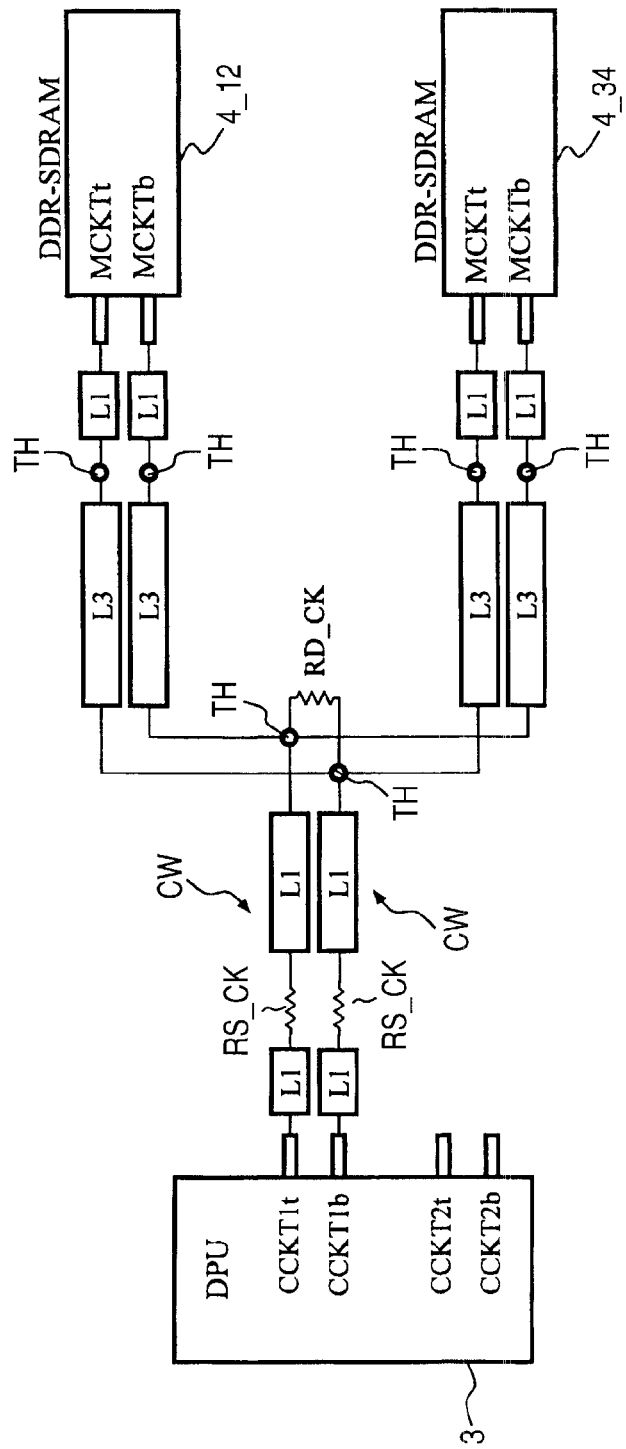
FIG. 11 is an explanatory view illustrating a wiring topology of the clock wiring CW when two DDR2-SDRAMs 4_12, 4_34 are mounted in the wiring substrate 2 as shown in FIG. 7.

FIG. 11 illustrates a wiring topology of the clock wiring CW when two DDR2-SDRAMs 4_12, 4_34 are mounted in the wiring substrate 2 as shown in FIG. 7. A differential clock output terminal CCKT1*t*, CCKT1*b* is coupled to corresponding clock input terminals MCKTt, MCKTb of two DDR2-SDRAMs 4_12, 4_34 via the clock wiring CW1 that is branched into two along its way. The differential clock output terminal CCKT2*t*, CCKT2*b* is not used, here. The load capacitance coupled to the clock wiring CW in FIG. 11 is the same as that of the case of FIG. 9.

Figure 12:
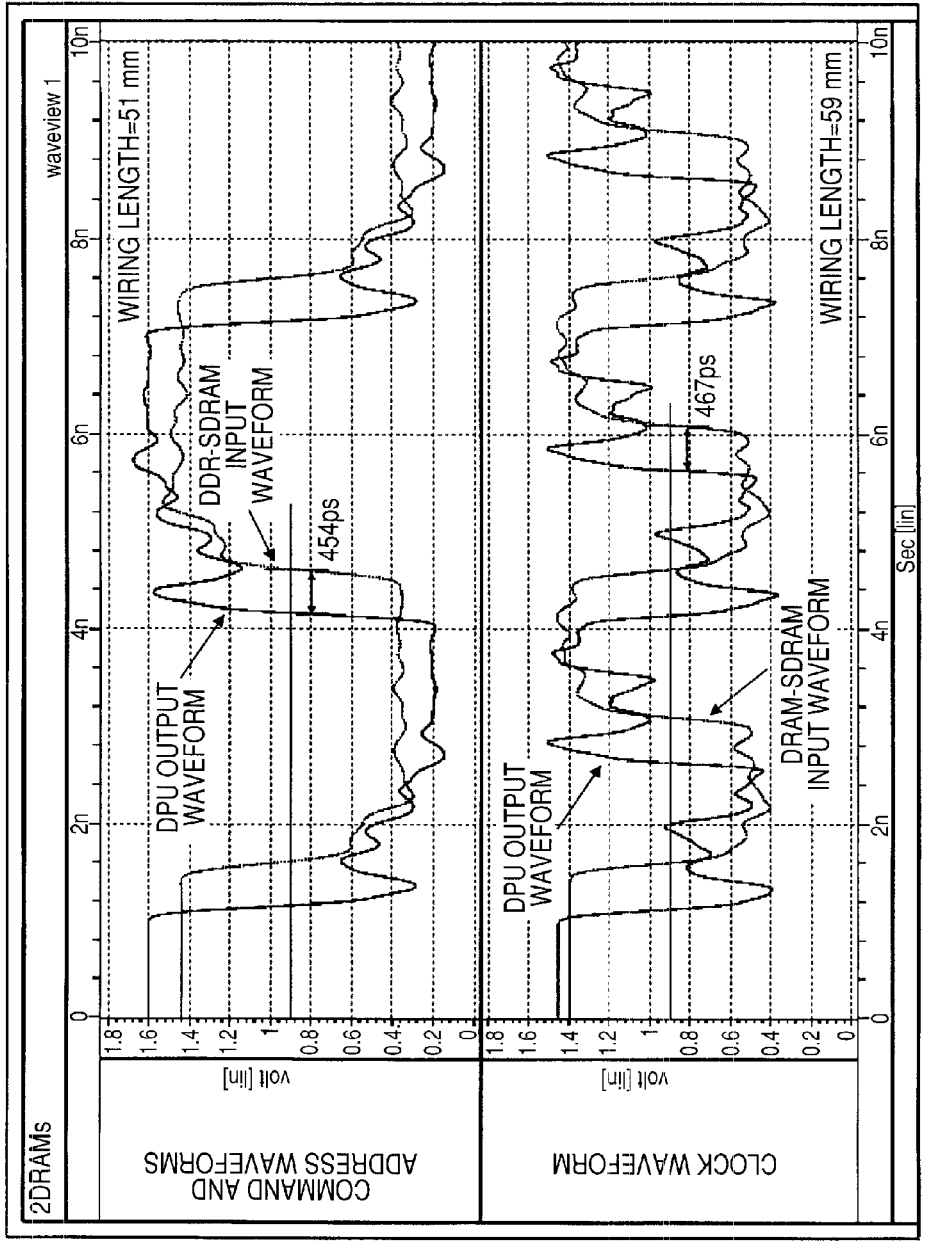
FIG. 12 shows waveforms illustrating a simulation waveform of a command and address signal and a simulation waveform of a clock signal when two DDR2-SDRAMs 4_12, 4_34 are mounted in the wiring substrate 2 described in FIG. 7.

FIG. 12 illustrates a simulation waveform of the command and address signal and a simulation waveform of the clock signal when two DDR2-SDRAMs 4_12, 4_34 are mounted in the wiring substrate 2 described in FIG. 7. As the command and address signal waveform, an output waveform in the command and address output terminal CCAT and an input waveform in the command and address input terminal MCAT of the DDR2-SDRAMs 4_12, 4_34 are shown. As the clock signal waveform, an output waveform in the clock output terminal CCKT and an input waveform in the clock input terminal MCKT of the DDR2-SDRAMs 4_12, 4_34 are shown. With respect to the command and address signal, a time difference (delay) of the input waveform of the DDR2-SDRAM relative to the output waveform of DPU is 454 ps, while with respect to the clock signal, a delay of the input waveform of the DDR2-SDRAM relative to the output waveform of DPU is 467 ps, and thus the both delays are almost the same. In this case, the wire length of the command and address signal wiring from the command and address output terminal CCAT to one address input terminal MCAT is set to 51 mm, and the wire length of the clock signal wiring from the clock output terminal CCKT to one clock input terminal MCKT is set to 59 mm.

Figure 13:
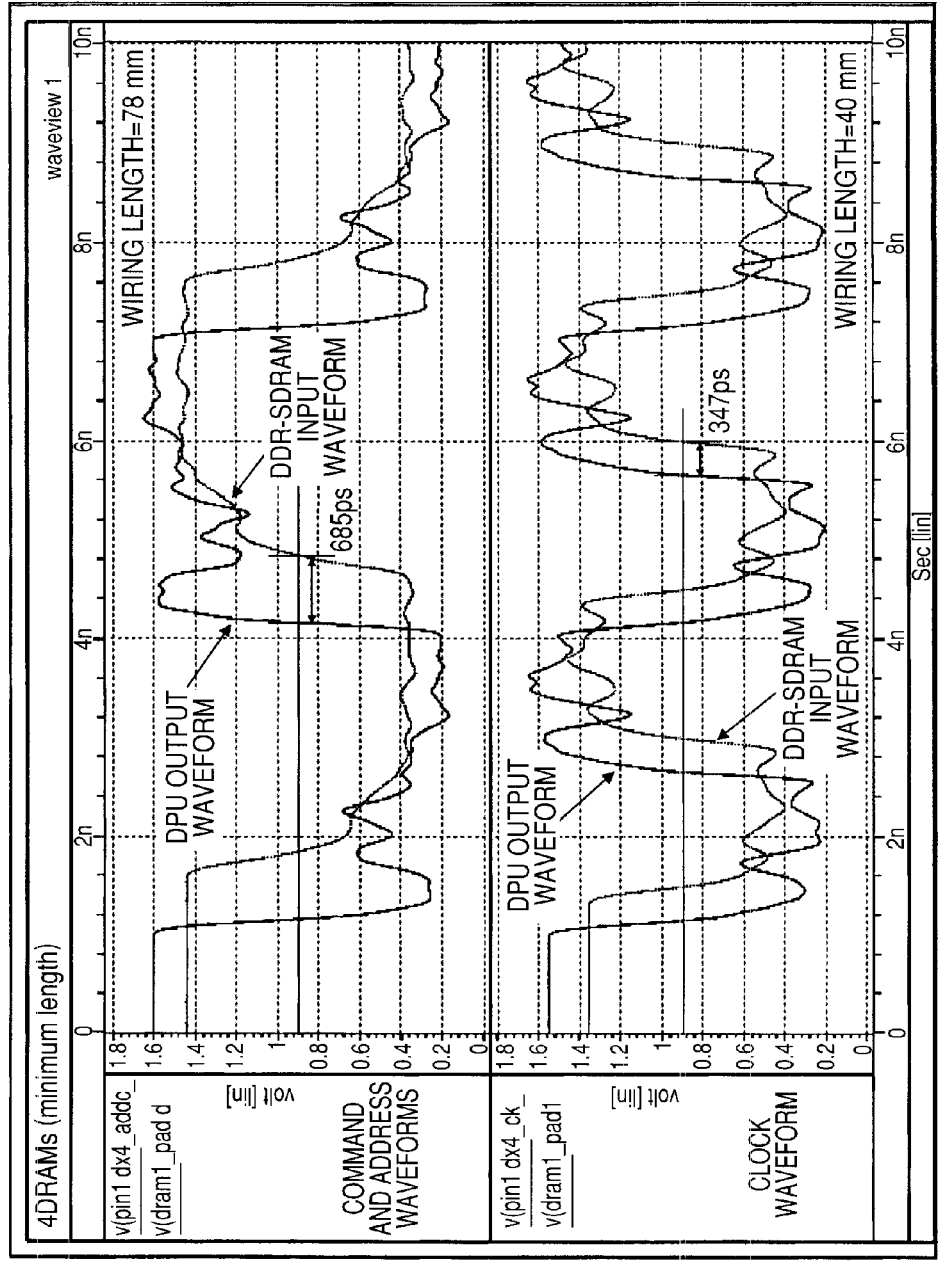
FIG. 13 shows waveforms illustrating a simulation waveform of the command and address signal and a simulation waveform of the clock signal when four DDR2-SDRAMs 4_1 to 4_4 are mounted in the wiring substrate 2 described in FIG. 2 and FIG. 3.

FIG. 13 illustrates a simulation waveform of the command and address signal and a simulation waveform of the clock signal when four DDR2-SDRAMs 4_1 to 4_4 are mounted in the wiring substrate 2 described in FIG. 2 and FIG. 3. As the command and address signal waveform, an output waveform in the command and address output terminal CCAT and an input waveform in the command and address input terminal MCAT of the DDR2-SDRAMs 4_1 to 4_4 are shown. As the clock signal waveform, an output waveform in the clock output terminal CCKT and an input waveform in the clock input terminal MCKT of the DDR2-SDRAMs 4_1 to 4_4 are shown. The clock signal waveform is a signal waveform when the length of the clock signal line is set to the minimum length. Incidentally, the wire length of the command and address signal wiring from the command and address output terminal CCAT to one address input terminal MCAT is set to 78 mm, while the wire length of the clock signal wiring from the clock output terminal CCKT to one clock input terminal MCKT is set to 40 mm. In this case, with respect to the command and address signal, the delay of the input waveform of the DDR2-SDRAM relative to the output waveform of DPU is 685 ps, while with respect to the clock signal, the delay of the input waveform of the DDR2-SDRAM relative to the output waveform of DPU is 347 ps, and thus the delay difference is 338 ps, which corresponds to 48 mm of the clock wiring. This difference results from the fact that when four DDR2-SDRAMs are mounted the load capacitance of the command and address wiring is approximately two times as compared with the case where two DDR2-SDRAMs are mounted. Other than this, the difference between the wire length in the case of FIG. 13 and the wire length in the case of FIG. 14, as would be apparent from the comparison between FIG. 2 as well as FIG. 3 and FIG. 7, relates also to a difference in the arrangement direction of the DDR2-SDRAM relative to the DPU.

<<Equalization of Delays Between Command and Address Signal and Clock Signal>>

Figure 14:
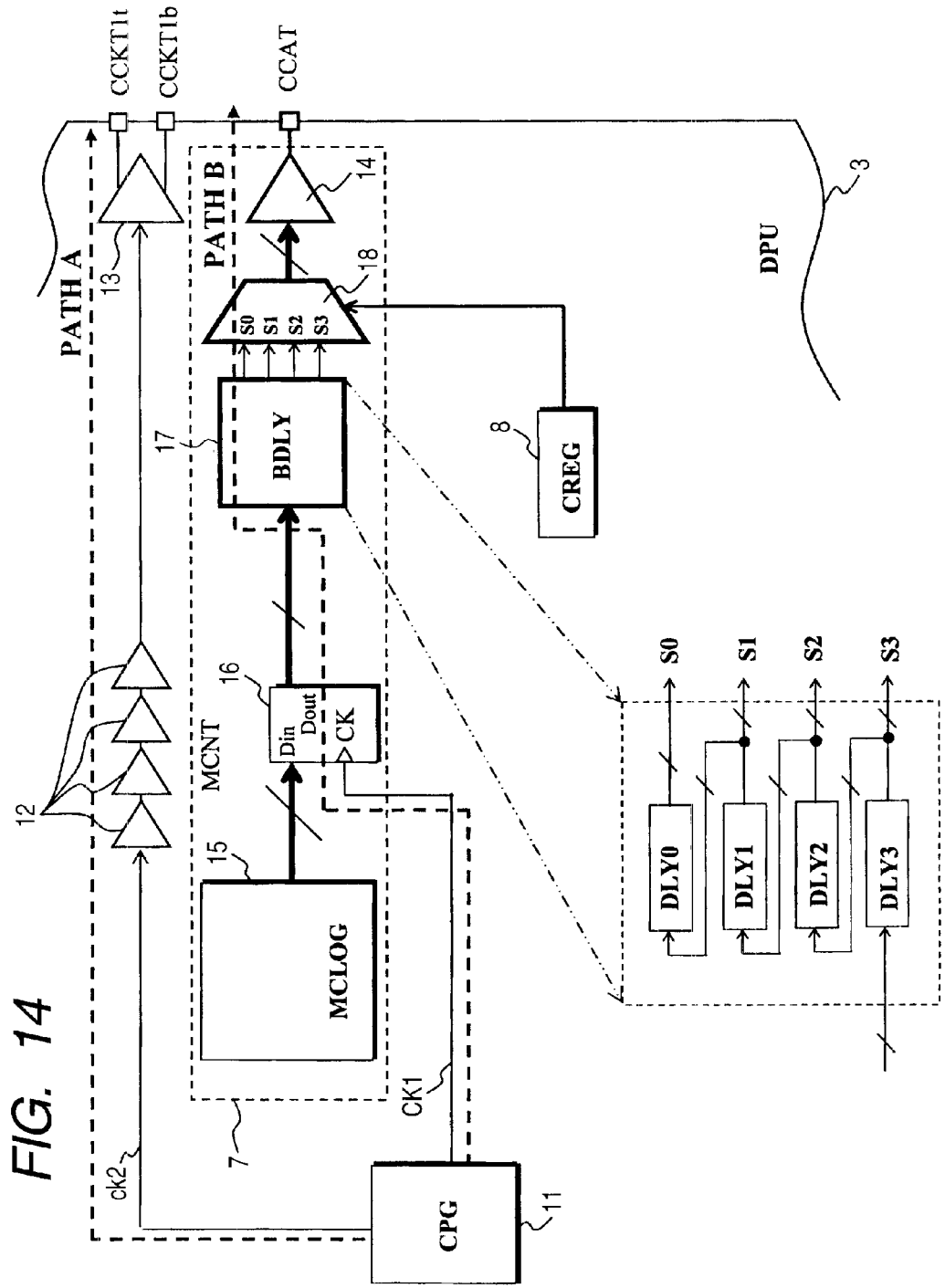
FIG. 14 is a block diagram illustrating a configuration for making output timing of the command and address signal variable.

When the cycle starting phase of the command and address signal output from the command and address terminal is equal to that of the clock signal output from the clock terminal, the delay in the command and address wiring and the delay in the clock wiring are preferably the same. This is because the command and address signal is synchronized with the clock signal. If the simulation waveforms of FIG. 14 are taken into consideration in mounting four DDR2-SDRAMs, then equalization of delays of the command and address and of the clock can be achieved by extending the clock signal wiring by 48 mm. However, the occupied area of the clock wiring in the wiring substrate 2 becomes too large by extending the clock wiring two times or more. Furthermore, this increases the round trip time due to a significant delay of the clock signal, and accordingly the memory read operation within a specified clock cycle might not be assured. Furthermore, a delay difference between the clock signal and the data strobe signal cannot satisfy the JEDEC specification. Then, in the memory controller 7, for the command and address signal output from the command and address output terminal CCAT, the output timing equal to or earlier than the cycle starting phase of the clock signal output from the clock output terminal CCKT can be selected.

FIG. 14 illustrates a configuration for making the output timing of the command and address signal variable. A clock pulse generator (CPG) 11 generates an internal clock signal serving as the reference of the internal operation of DPU 3, with a non-illustrated oscillator or system clock as the source oscillation. Here, internal clock signals ck1, ck2 are representatively shown, wherein ck2 denotes an operation reference clock signal of DPU 3 and ck1 denotes a clock signal obtained by dividing the clock-signal ck2 by two. The clock signals represented by ck1, ck2 are supplied through a clock tree circuit (not shown), in which a clock driver is arranged on its way, to each corresponding part. Reference numeral 12 schematically indicates delay components of such a clock tree circuit. In the memory controller 7, reference numeral 15 generically refers to a logic circuit for carrying out interface control of the DDR2-SDRAM. FIG. 14 representatively shows a configuration for generating an output of the command and address terminal CCAT and an output of the clock terminal CCKT (CCKTt, CCKTb). A clock output buffer 13 outputs an operating clock signal from the clock terminals CCKTt, CCKTb in accordance with the cycle of the clock signal ck2. A latch circuit 16 is positioned in the output path of the command and address signal, and the clock signal ck1 is supplied to a clock terminal of this latch circuit. The command and address signal which the logic circuit 15 outputs is synchronized with the clock signal ck1 in the latch circuit 16, and is then supplied to a variable delay circuit (BDLY) 17. The variable delay circuit 17 includes serially-coupled four stages of gate delay circuits DLY0 to DLY3, for example, and, upon receipt of the output of the latch circuit 16 at the first stage DLY3, the variable delay circuit 17 forms the delay outputs S3, S2, S1, and S0 whose delay time is increased in the order of DLY2, DLY1, and DLY0. One of the delay outputs S3 to S0 is selected by a selector 18, and then an output buffer 14 outputs the command and address signal from the command and address output terminal CCAT in accordance with the selected signal. Although the detailed illustration is omitted, required multiple bits of command and address signal-system output paths are formed. The selected status by the selector 18 is determined by the trimming data (control data) that is initialized in the control register 8 by CPU 6 in the power-on-reset processing.

Figure 16:
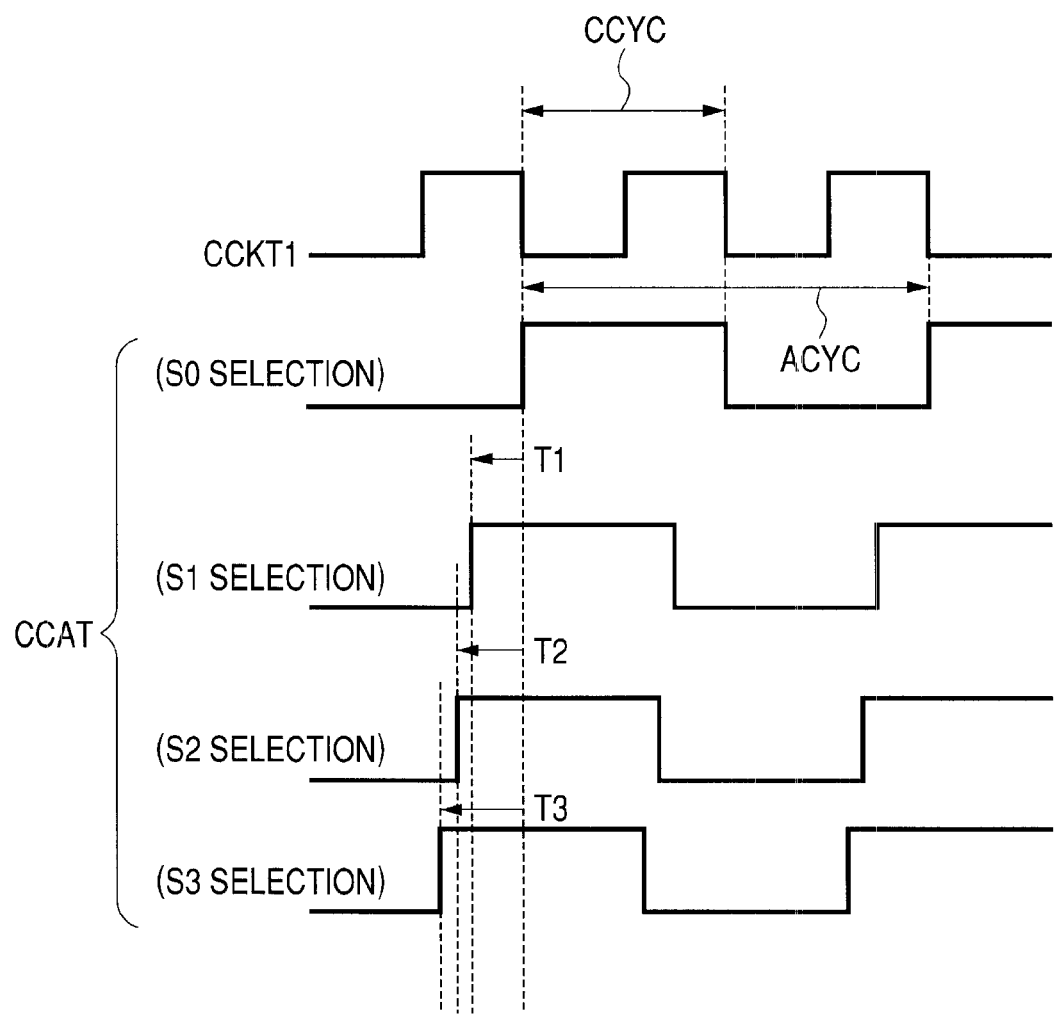
FIG. 16 is a timing chart illustrating output phases of the command and address signal that can be selected by a selector.

FIG. 16 illustrates the output phases of the command and address signal that can be selected by the selector. In FIG. 16, one access cycle of the command and address signal is represented by a clock cycle for ease of illustration. Reference symbol CCYC denotes the clock cycle of the clock signal output from the clock output terminal CCKT, and ACYC denotes the access cycle of the command and address signal output from the command and address output terminal. A case where the frequency of the clock signal is twice the frequency of the command and address signal is taken as an example.

The delay time of the delay output S0 selected by the selector 18 is a delay time when the access cycle of the command and address signal output from the command and address output terminal CCAT is in phase with the clock cycle CCYC of the clock output terminal CCKT. The delay time of the delay output S1 selected by the selector 18 is a time shorter than the delay time S0 by T1 (e.g., 300 ps). The delay time of the delay output S2 selected by the selector 18 is a time shorter than the delay time S0 by T2 (e.g., 330 ps). The delay time of the delay output S3 selected by the selector 18 is a time shorter than the delay time S0 by T3 (e.g., 360 ps).

Therefore, when a wiring pattern having the characteristics as shown by the simulation waveforms of FIG. 13 is employed in the wirings on the wiring substrate 2 to mount four DDR2-SDRAMs 4_1 to 4_4, the trimming data for causing DPU 3 to select the delay time S2 in the power-on-reset is written in the flash memory 5 in advance, and thereby the waveforms will reach the command and address terminal of the DDR2-SDRAM and the clock terminal of the DDR2-SDRAM in phase without undesirably lengthening the clock wiring. In other words, pseudo-equalization of delays of the command and address signal and the clock signal can be realized. Since there is a plurality of choices here, even a case where there is a delay difference between the command and address signal and the clock signal can be easily handled.

On the other hand, when a wiring pattern having the characteristics as shown by the simulation waveforms of FIG. 12 is employed in the wirings on the wiring substrate 2 to mount two DDR2-SDRAMs 4_12, 4_34, trimming data for causing DPU 3 to select the delay time S0 in the power-on-reset is written in the flash memory 5 in advance, and thereby the equalization of delays of the command and address signal and the clock signal can be realized.

Figure 15:
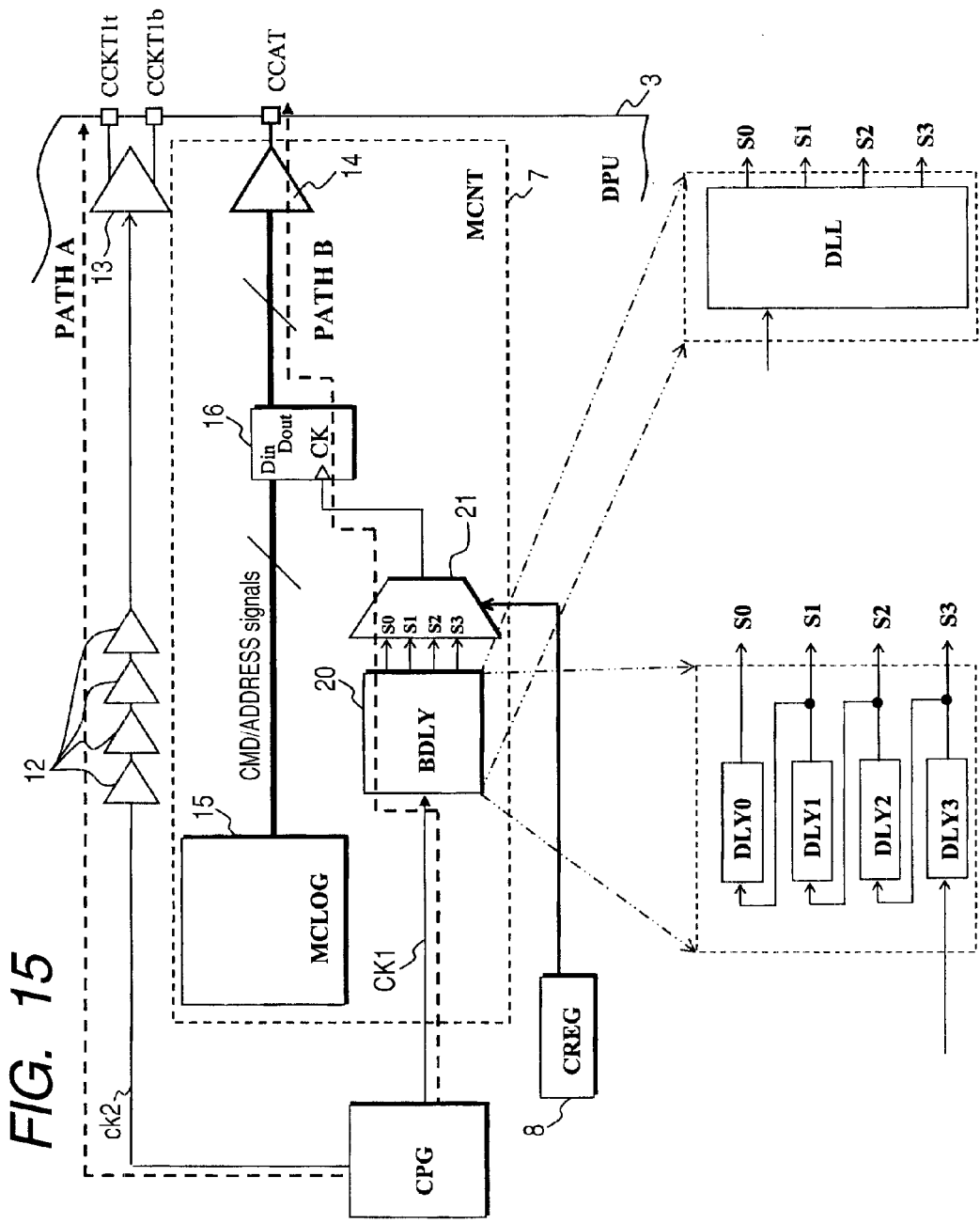
FIG. 15 is a block diagram illustrating another configuration for making output timing of the command and address signal variable.

FIG. 15 illustrates another configuration for making the output timing of the command and address signal variable. This configuration differs from that of FIG. 14 in that a variable delay circuit 20 and a selector 21 are arranged in a latch clock input path of the latch circuit 16. That is, the variable delay circuit (BDLY) 20 receives the clock signal, and the output of the selector 21 that receives and selects the outputs S0 to S3 of the variable delay circuit (BDLY) 20 is supplied to the clock terminal CK of the latch circuit 16. The variable delay circuit 20, for example, includes serially-coupled four stages of gate delay circuits DLY0 to DLY3, for example, and upon receipt of the clock signal ck1 at the first stage delay DLY3, the variable delay circuit 20 forms the delay outputs S3, S2, S1, and S0 whose delay time is increased in the order of DLY2, DLY1, and DLY0. One of the delay outputs S3 to S0 is selected by the selector 21. The latch circuit 16 latches the command and address signal in synchronization with the clock signal output from the selector 21, and supplies this to the output buffer 14. Although the detailed illustration is omitted, required multiple bits of command and address signal-system output paths are formed. The selected status by the selector 21 is determined by the trimming data (control data) that is initialized in the control register 8 by CPU 6 in the power-on-reset processing. The output phases of the clock signals S0 to S3 that can be selected by the selector 21 determine the access cycle of the command and address signal output from the command and address output terminal CCAT, as shown in FIG. 16.

Moreover, the variable delay circuit is not limited to the serially-coupled four stages of gate delay circuits DLY0 to DLY3, but a DLL circuit may be employed.

Also when the configuration of FIG. 15 is employed, the equalization of delays of the command and address signal and the clock signal can be achieved without undesirably making the clock wiring longer, as in FIG. 14. In addition, since the variable delay circuit 20 and the selector 21 are arranged in the transmission system of the clock signal ck1, the variable delay circuit 20 and the selector 21 require a configuration just for one-bit, respectively. In the configuration of FIG. 14, the same number of variable delay circuits 17 and selectors 18 as the number of bits of the command and address signal needs to be provided. In this respect, FIG. 15 can reduce the circuit sizes of the variable delay circuit and the selector as compared with those of FIG. 14.

As described above, the invention made by the present inventor has been specifically described based on the embodiments, however, the present invention is not limited thereto, and various modifications can be made without departing from the gist of the invention.

For example, the memory device is not limited to the DDR2-SDRAM. The number of parallel data input/output bits of the memory device is not limited to 8 bits or 16 bits. The number of memory devices is not limited to four, but is adapted corresponding to a difference between the delay of the command and address wiring and the delay of the clock wiring. The data processing device is not limited to a general-purpose application, but may include a data processing function specialized in processings, such as image processing, audio processing, or encoding/decoding, in accordance with the device-embedded application. The flash memory for storing therein the trimming data or the like for initialization may be in the form of an on-chip device or a SIP (System In Package) in place of an external device. Moreover, the data processing device may include multiple sets of memory interface functions for a memory device. For example, the memory controller 7 may include two channels of the above-described memory interfaces, and the memory interface terminal of each of the memory interface channels may be arranged at two diagonal corner portions in DPU 3 of FIG. 2 and FIG. 3. Each of the memory interface channels may operate independently. The memory interface terminal may be arranged along one side instead of at the corner portions. Furthermore, the present invention is not limited to the mother board type, but may be configured as a daughter board for the mother board or may be configured as a SIP type.

What is claimed is:

1. An electronic device, comprising:
   a wiring substrate having a first surface and a second surface opposite to the first surface;
   a data processing device having a plurality of first data system terminals, a plurality of second data system terminals, a plurality of third data system terminals, a plurality of fourth data system terminals, a first clock terminal, a second clock terminal and a command address terminal, and mounted on the first surface of the wiring substrate;
   a first memory device having a plurality of data system terminals, a clock terminal and a command address terminal, and mounted on the first surface of the wiring substrate and arranged next to the data processing device in a plan view;
   a second memory device having a plurality of data system terminals, a clock terminal and a command address terminal, and mounted on the first surface of the wiring substrate and arranged next to the data processing device in the plan view;
   a third memory device having a plurality of data system terminals, a clock terminal and a command address terminal, and mounted on the second surface of the wiring substrate such that the first memory device is arranged over the third memory device in the plan view; and
   a fourth memory device having a plurality of data system terminals, a clock terminal and a command address terminal, and mounted on the second surface of the wiring substrate such that the second memory device is arranged over the fourth memory device in the plan view, and arranged next to the third memory device in the plan view;
   wherein the first data system terminals of the data processing device are coupled to the data system terminals of the first memory device through a plurality of first data wiring of the wiring substrate;
   wherein the second data system terminals of the data processing device are coupled to the data system terminals of the second memory device through a plurality of second data wiring of the wiring substrate;
   wherein the third data system terminals of the data processing device are coupled to the data system terminals of the third memory device through a plurality of third data wiring of the wiring substrate;
   wherein the fourth data system terminals of the data processing device are coupled to the data system terminals of the fourth memory device through a plurality of fourth data wiring of the wiring substrate;
   wherein the first clock terminal of the data processing device is coupled to the clock terminal of each of two of the first, second, third and fourth memory devices through a first clock wiring of the wiring substrate; and
   wherein the second clock terminal of the data processing device is coupled to the clock terminal of each of others of the first, second, third and fourth memory devices through a second clock wiring of the wiring substrate.

2. The electronic device according to claim 1, wherein the first clock wiring is divided into a first part and a second part at a first branch point arranged between the first clock terminal of the data processing device and the clock terminal of each of two of the first, second, third and fourth memory devices; and
   wherein the second clock wiring is divided into a first part and a second part at a second branch point arranged between the second clock terminal of the data processing device and the clock terminal of each of others of the first, second, third and fourth memory devices.

3. The electronic device according to claim 2, wherein the first clock terminal of the data processing device is coupled to the clock terminal of the first memory device through the first part of the first clock wiring;
   wherein the first clock terminal of the data processing device is coupled to the clock terminal of the third memory devices through the second part of the first clock wiring;
   wherein the second clock terminal of the data processing device is coupled to the clock terminal of the second memory device through the first part of the second clock wiring;
   wherein the second clock terminal of the data processing device is coupled to the clock terminal of the fourth memory devices through the second part of the second clock wiring.

4. The electronic device according to claim 1, wherein the command address terminal of the data processing device is coupled to the command address terminal of each of the first, second, third and fourth memory devices through a command address wiring of the wiring substrate.

5. The electronic device according to claim 4, wherein the data processing device outputs a command address signal to the first, second, third and fourth memory devices through the command address wiring as a first frequency;
   wherein the data processing device outputs a first clock signal to the two of the first, second, third and fourth memory devices through the first clock wiring as a second frequency, which is higher than the first frequency; and
   wherein the data processing device outputs a second clock signal to the others of the first, second, third and fourth memory devices through the second clock wiring as the second frequency.

6. The electronic device according to claim 5, wherein the command address wiring is divided into a first part and a second part at a first branch point arranged between the command address terminal of the data processing device and the command address terminal of each of the first, second, third and fourth memory devices;
   wherein the first part of the command address wiring is divided into a third part and a fourth part at a second branch point arranged between the first branch point and the command address terminal of each of two of the first, second, third and fourth memory devices; and
   wherein the second part of the command address wiring is divided into a fifth part and a sixth part at a third branch point arranged between the first branch point and the command address terminal of each of others of the first, second, third and fourth memory devices.

7. The electronic device according to claim 6, wherein the first clock terminal of the data processing device is coupled to the clock terminal of each of two of the first, second, third and fourth memory devices through a first clock wiring of the wiring substrate; and
   wherein the second clock terminal of the data processing device is coupled to the clock terminal of each of others of the first, second, third and fourth memory devices through a second clock wiring of the wiring substrate;
   wherein the first part of the command address wiring is divided into a third part and a fourth part at a second branch point arranged between the first branch point and the command address terminal of each of two of the first, second, third and fourth memory devices; and
   wherein the second part of the command address wiring is divided into a fifth part and a sixth part at a third branch point arranged between the first branch point and the command address terminal of each of others of the first, second, third and fourth memory devices.

* * * * *